(12) United States Patent  
Maruko et al.

(10) Patent No.: US 8,125,278 B2  
(45) Date of Patent: Feb. 28, 2012

(54) CLOCK REGENERATION APPARATUS AND ELECTRIC EQUIPMENT

(75) Inventors: Kenichi Maruko, Kanagawa (JP); Hiroki Kihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 81 days.

(21) Appl. No.: 12/662,506

(22) Filed: Apr. 21, 2010

(65) Prior Publication Data

US 2010/0301950 A1 Dec. 2, 2010

(30) Foreign Application Priority Data

Jun. 2, 2009 (JP) ................. 2009-133238

(51) Int. Cl.
*H03L 7/00* (2006.01)
(52) U.S. Cl. ............. 331/1 A; 311/16; 311/34; 311/25; 311/57; 327/156; 327/159; 375/376; 375/355; 375/371; 375/375
(58) Field of Classification Search ............ 331/1 A, 331/16, 34, 57, 25; 327/156, 159; 375/376, 375/355, 371, 375
See application file for complete search history.

(56) References Cited

U.S. PATENT DOCUMENTS

| | | | |
|---|---|---|---|
| 5,237,290 A | 8/1993 | Banu et al. | |
| 6,259,326 B1 | 7/2001 | Dunlop et al. | |
| 7,302,026 B2 * | 11/2007 | Kaeriyama et al. | 375/355 |
| 7,667,544 B2 * | 2/2010 | Sugawara et al. | 331/1 A |
| 2004/0046596 A1 | 3/2004 | Kaeriyama et al. | |
| 2007/0159938 A1 | 7/2007 | Sugawara et al. | |

FOREIGN PATENT DOCUMENTS

JP 08-213979 8/1996

OTHER PUBLICATIONS

Extended European Search Report issued Dec. 27, 2010 for corresponding European Application No. 10 00 4754.
Banu M et al., "Clock Recovery Circuits with Instantaneous Locking" Electronics Letters, IEE Stevenage, GB, vol. 28, No. 23, Nov. 5, 1992 pp. 2127-2130, XP000315942, ISSN: 0013-5194.

* cited by examiner

*Primary Examiner* — Arnold Kinkead
(74) *Attorney, Agent, or Firm* — Rader, Fishman & Grauer PLLC

(57) ABSTRACT

Disclosed herein is a clock regeneration apparatus, including: an oscillator including n (an integer of two or more) gating groups connected in cascade connection to each other forming an oscillation loop, the gating groups being controlled to gate an internal clock signal with first to nth gating signals different from one another, respectively, the oscillator outputting a clock signal at least from the nth one of the gating groups; an edge detection section adapted to detect an edge of a reception data signal; a phase decision section adapted to decide a phase of the clock signal for each edge of the reception data signal and output a result of the decision as a phase decision signal; and a gating signal generation section adapted to generate the first to nth gating signals and output the gating signals to first to nth ones of the gating groups, respectively.

11 Claims, 34 Drawing Sheets

FIG. 35

| | UPON EDGE INPUTTING | | PHASE DECISION SIGNAL | GATING SIGNAL | DELAY TIME | CLOCK SIGNAL SYNCHRONIZED AFTER 3T0 OF EDGE INPUTTING |
|---|---|---|---|---|---|---|
| | CLOCK SIGNAL 90 | CLOCK SIGNAL 0 | | | | |
| CASE 1 | L | L | 00 | A | 0 | FALLING EDGE OF CLOCK SIGNAL 90 |
| CASE 2 | L | H | 01 | B | 2T0 | RISING EDGE OF CLOCK SIGNAL 0 |
| CASE 3 | H | L | 10 | A | T0 | FALLING EDGE OF CLOCK SIGNAL 0 |
| CASE 4 | H | H | 11 | B | T0 | RISING EDGE OF CLOCK SIGNAL 90 |

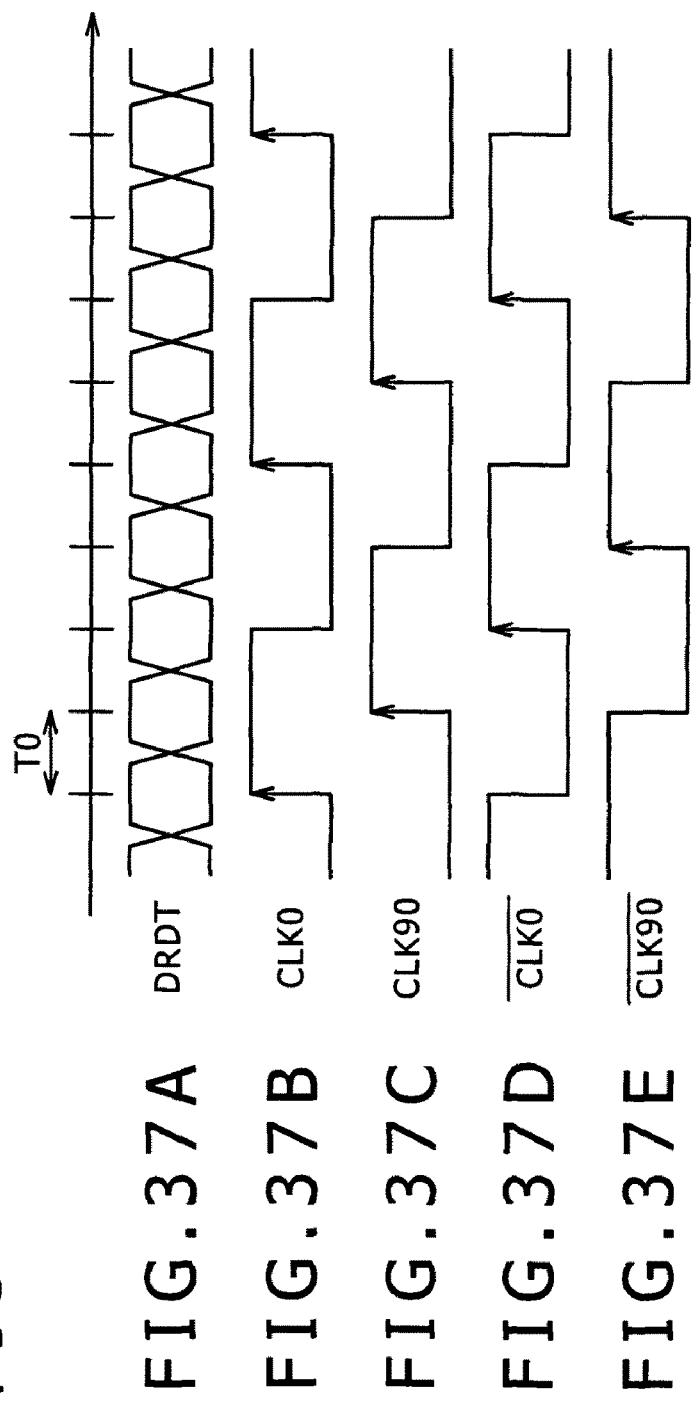

CLOCK REGENERATION APPARATUS AND ELECTRIC EQUIPMENT

BACKGROUND OF THE INVENTION

1. Field of the Invention

This invention relates to a clock regeneration apparatus and an electronic equipment wherein a clock synchronized with a reception data signal is regenerated.

2. Description of the Related Art

In recent years, the demand for transfer of a large amount of data at a high speed and with low power consumption is increasing in the field of digital transmission, and a clock regeneration apparatus is used widely in interfaces for such data transfer.

Further, in high speed interfaces, jitter components included in a signal are increasing together with increase of the transfer rate, and also the tolerance to jitters is demanded.

As a system of a clock regeneration apparatus, a system which applies a PLL (Phase Locked Loop) and a system which selects or produces a clock of a phase synchronized with a reception data signal from a multi-phase clock signal are available.

However, if it is tried to raise the transfer rate in the systems mentioned, then a phase comparator which operates at a high speed is required, and this makes increase of the transfer rate difficult.

Further, in the systems mentioned, since synchronism with a reception data signal is implemented by negative feedback, the time required for synchronization of the clock signal with the reception data signal is long. Therefore, the systems mentioned are not suitable for burst data transfer for which synchronization with the reception data signal in a short period of time is required.

Meanwhile, a clock regeneration system which uses a voltage-controlled oscillator with a gate (hereinafter referred to as gated VCO) has been proposed and is disclosed, for example, in M. Banu and A. E. Dunlop, "Clock Recovery Circuits with Instantaneous Locking," Electronics Letters, Vol. 28, No. 23, Nov. 1992, pp. 2127 to 2130 (hereinafter referred to as Non-Patent Document 1).

In the clock regeneration system, no phase comparator is required and increase of the speed is not limited by a phase comparator. Further, it is possible to establish instantaneous synchronism with a reception data signal.

FIG. 1 shows an example of a popular clock regeneration system of the gated VCO type, which is disclosed, for example, in Japanese Patent Laid-Open No. Hei 8-213979 (hereinafter referred to as Patent Document 1).

FIGS. 2A to 2C illustrate operation timings of an edge detector shown in FIG. 1.

Referring to FIGS. 1 and 2A to 2C, the clock regeneration apparatus 1 includes an edge detector 2 and a voltage-controlled oscillator 3.

The edge detector 2 includes a delay circuit 21 and an exclusive OR gate (EXOR) 22.

A reception data signal rdt is inputted to the edge detector 2.

In the edge detector 2, the reception data signal rdt is delayed by the delay circuit 21, and the resulting delay signal S21 is supplied to the EXOR gate 22. The EXOR gate 22 exclusively ORs the reception data signal rdt and the delay signal S21 inputted thereto and outputs a result of the exclusive ORing as a gating signal S2 to the voltage-controlled oscillator 3.

The oscillation frequency of the voltage-controlled oscillator 3 is controlled by an oscillation frequency controlling voltage fcv, and a clock signal S3 is outputted at a timing in accordance with the gating signal S2.

SUMMARY OF THE INVENTION

However, in the system described hereinabove which uses a gated VCO, since the clock signal S3 of a frequency corresponding to the transfer rate of the reception data signal rdt is to be outputted, it is necessary for the voltage-controlled oscillator 3 to be a full rate oscillator.

Therefore, if it is tried to increase the speed in the above-described system which uses a gated VCO, then the increase of the speed is restricted by the oscillation frequency of the voltage-controlled oscillator 3.

Further, since the voltage-controlled oscillator 3 which operates at a high-speed oscillation frequency is required, increase of power consumption is invited.

Further, if one period of the transfer rate is T0 second (for example, where the transfer rate is 5 Gbps, T0=200 psec.), then the gating signal S2 is outputted in the following manner.

In particular, in the edge detector 2 of the clock regeneration apparatus 1 of the gated VCO type described above, the EXOR gate 22 outputs the gating signal S2 obtained by exclusive ORing of the reception data signal rdt and the delay signal S21 delayed by T0/2 by the delay circuit 21 as a pulse signal.

Therefore, if the phase of the reception data signal rdt is fluctuated by jitter components of the reception data signal rdt and the interval between adjacent edges of the reception data signal rdt becomes equal to T0/2, then pulse signals corresponding to the edges fail to be outputted as the clock signal S3.

FIGS. 2A to 2C illustrate an example of operation of an edge detector used in the clock regeneration apparatus of the gated VCO type described hereinabove. As seen from FIGS. 2A to 2C, the tolerance to jitters of the reception data signal rdt is restricted.

Therefore, it is desired to provide a clock regeneration apparatus and an electronic apparatus which can detect an edge of a reception data signal precisely even if an edge position fluctuation of the reception data signal occurs and can achieve increase of the transfer rate and reduction of the power consumption.

According to an embodiment of the present invention, there is provided a clock regeneration apparatus including: an oscillator including n gating groups connected in cascade connection to each other in such a manner as to be capable of forming an oscillation loop, n being an integer of two or more, the gating groups being controlled to gate an internal clock signal with first to nth gating signals different from one another, respectively, the oscillator outputting a clock signal at least from the nth one of the gating groups. The clock regeneration apparatus further includes: an edge detection section adapted to detect an edge of a reception data signal; a phase decision section adapted to decide a phase of the clock signal for each edge of the reception data signal and output a result of the decision as a phase decision signal; and a gating signal generation section adapted to generate the first to nth gating signals and output the gating signals to first to nth ones of the gating groups of the oscillator, respectively. In the clock regeneration apparatus, the gating signal generation section is operable to select one of the gating signals into which an edge detection signal of the edge detection section is to be injected in response to the phase decision signal of the phase decision section, delay the selected gating signal and output the gating signal to the oscillator. The oscillator outputs the clock signal having a phase controlled based on the first to nth gating signals and synchronized with the reception data signal.

According to another embodiment of the present invention, there is provided a clock regeneration apparatus including: an oscillator including first and second gating groups connected in cascade connection to each other in such a manner as to be capable of forming an oscillation loop, the first and second gating groups being controlled to gate an internal clock signal with first and second gating signals different from each other, respectively, the oscillator outputting a clock signal at least from the second gating group. The clock regeneration apparatus further includes: an edge detection section adapted to detect an edge of a reception data signal; a phase decision section adapted to decide a phase of the clock signal for each edge of the reception data signal and output a result of the decision as a phase decision signal; and a gating signal generation section adapted to generate the first and second gating signals and output the first and second gating signals to the first and second gating groups of the oscillator, respectively. In the clock regeneration apparatus, the gating signal generation section is operable to generate, as the first gating signal, one of a signal which indicates rising edge detection and another signal which indicates falling edge detection based on a result of the detection by the edge detection section in response to a phase decision signal of the phase decision section, and delay the other one of the signals by one half cycle that of the reception data signal to generate the second gating signal. The oscillator outputs the clock signal having a phase controlled based on the first and second gating signals and synchronized with the reception data signal.

According to a third embodiment of the present invention, there is provided an electronic equipment including a clock regeneration apparatus, and a functional block adapted to carry out a process for a reception data signal in synchronism with a clock signal regenerated by the clock regeneration apparatus. The clock regeneration apparatus includes: an oscillator including n gating groups connected in cascade connection to each other in such a manner as to be capable of forming an oscillation loop, n being an integer of two or more, the gating groups being controlled to gate an internal clock signal with first to nth gating signals different from one another, respectively, the oscillator outputting a clock signal at least from the nth one of the gating groups. The clock regeneration apparatus further includes: an edge detection section adapted to detect an edge of a reception data signal; a phase decision section adapted to decide a phase of the clock signal for each edge of the reception data signal and output a result of the decision as a phase decision signal; and a gating signal generation section adapted to generate the first to nth gating signals and output the gating signals to first to nth ones of the gating groups of the oscillator, respectively. In the clock regeneration apparatus, the gating signal generation section is operable to select one of the gating signals into which an edge detection signal of the edge detection section is to be injected in response to the phase decision signal of the phase decision section, delay the selected gating signal and output the gating signal to the oscillator. The oscillator outputs the clock signal having a phase controlled based on the first to nth gating signals and synchronized with the reception data signal.

According to a still further embodiment of the present invention, there is provided an electronic equipment including a clock regeneration apparatus, and a functional block adapted to carry out a process for a reception data signal in synchronism with a clock signal regenerated by the clock regeneration apparatus. The clock regeneration apparatus includes: an oscillator including first and second gating groups connected in cascade connection to each other in such a manner as to be capable of forming an oscillation loop, the first and second gating groups being controlled to gate an internal clock signal with first and second gating signals different from each other, respectively, the oscillator outputting a clock signal at least from the second gating group. The clock generation apparatus further includes: an edge detection section adapted to detect an edge of a reception data signal; a phase decision section adapted to decide a phase of the clock signal for each edge of the reception data signal and output a result of the decision as a phase decision signal; and a gating signal generation section adapted to generate the first and second gating signals and output the first and second gating signals to the first and second gating groups of the oscillator, respectively. In the clock regeneration apparatus, the gating signal generation section is operable to generate, as the first gating signal, one of a signal which indicates rising edge detection and another signal which indicates falling edge detection based on a result of the detection by the edge detection section in response to a phase decision signal of the phase decision section, and delay the other one of the signals by one half cycle that of the reception data signal to generate the second gating signal. The oscillator outputs the clock signal having a phase controlled based on the first and second gating signals and synchronized with the reception data signal.

In the clock regeneration apparatus and the electronic equipments, the phase of the clock signal is synchronized with the reception data signal for each edge of the reception data signal, and the clock signal of the synchronized phase is outputted as a clock pulse.

Further, edge injection into the voltage-controlled oscillator can be carried out from a plurality of places of the voltage-controlled oscillator by a gating signal, and a rising edge is synchronized in response to the injection from at least one place while a falling edge is synchronized in response to the injection from at least another one place.

With the clock regeneration apparatus and the electronic equipments, even if a fluctuation of an edge position of the reception data signal occurs, edge detection can be carried out precisely, and increase of the transfer rate and reduction of the power consumption can be implemented.

The above and other features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 35 is a view illustrating a relationship of a clock signal, a phase decision signal, a gating signal, delay time and an edge input to a clock signal in the clock regeneration apparatus of FIG. 32;

FIG. 37 is a timing chart illustrating an example of operation of the connection scheme of FIG. 36.

DETAILED DESCRIPTION OF THE PREFERRED EMBODIMENTS

In the following, preferred embodiments of the present invention are described with reference to the drawings.

It is to be noted that the description is given in the following order:

1. First Embodiment (first example of a configuration of a clock regeneration apparatus ready for a sub rate)
2. Second Embodiment (second example of a configuration of a clock regeneration apparatus ready for a sub rate)
3. Third Embodiment (first example of a configuration of a clock regeneration apparatus ready for a half rate)
4. Fourth Embodiment (second example of a configuration of a clock regeneration apparatus ready for a half rate)
5. Fifth Embodiment (modification to the third embodiment)
6. Sixth Embodiment (modification to the fourth embodiment)
7. Seventh Embodiment (example of a configuration of an electronic equipment)
8. Eighth Embodiment (example of a configuration of a clock regeneration apparatus ready for two-clock regeneration)

Configuration Generalized for Sub Rate Operation

First, description is given of a configuration of a clock regeneration operation of sub rate operation generalized to a case wherein the number of stages of gating groups which configure a voltage-controlled oscillator (VCO) is n which is an integer equal to or greater than 2.

Two configurations are available as the configuration of the clock regeneration apparatus. According to one of the configurations, the oscillation frequency of the VCO is 1/n to the data rate of a reception data signal, and according to the other one of the configurations, the oscillation frequency of the VCO is 1/2n.

Thus, the former is referred to as first sub rate configuration and the latter is referred to as second sub rate configuration, and the first and second sub rate configurations are described in order as first and second embodiments, respectively.

Further, after the description of the first and second embodiments, clock regeneration apparatus ready for a half rate corresponding to n=2 which have the first sub rate configuration are described as third to sixth embodiments.

1. First Embodiment

First Sub Rate Configuration

Figure 1:
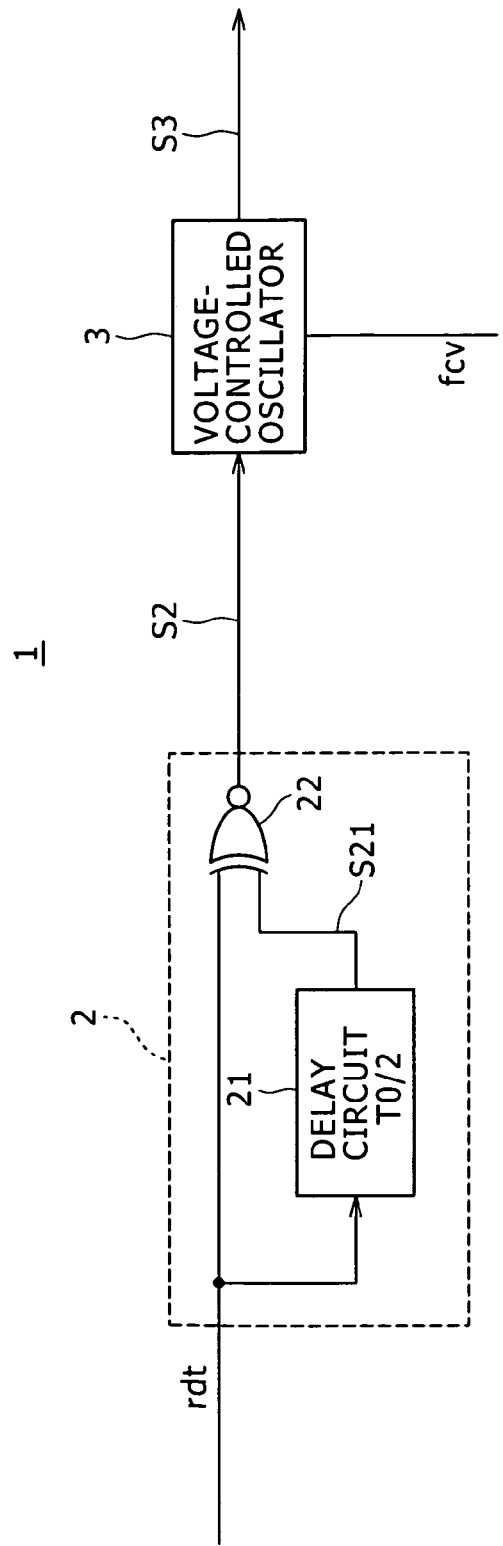
FIG. 1 is a block diagram showing an example of a popular clock regeneration system of a gated VCO type.
Figure 2:
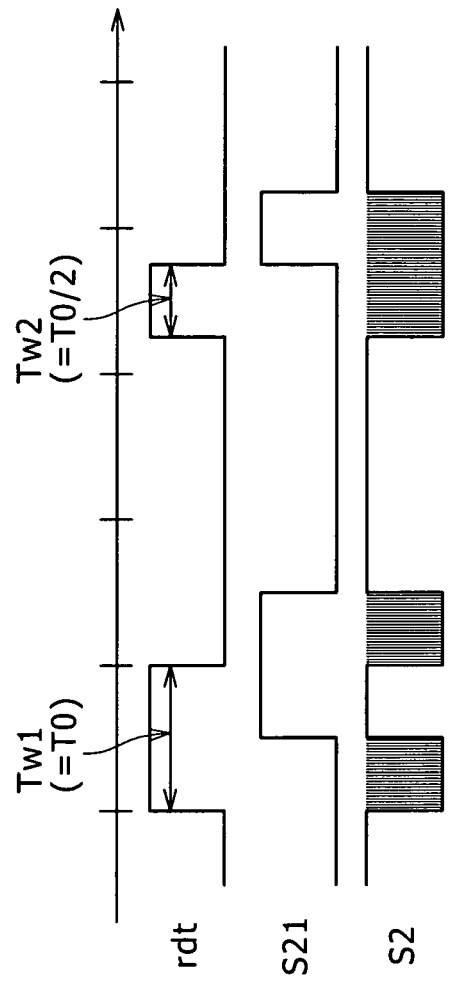
FIGS. 2A to 2C are timing charts illustrating operation timings of an edge detector shown in FIG. 1.
Figure 3:
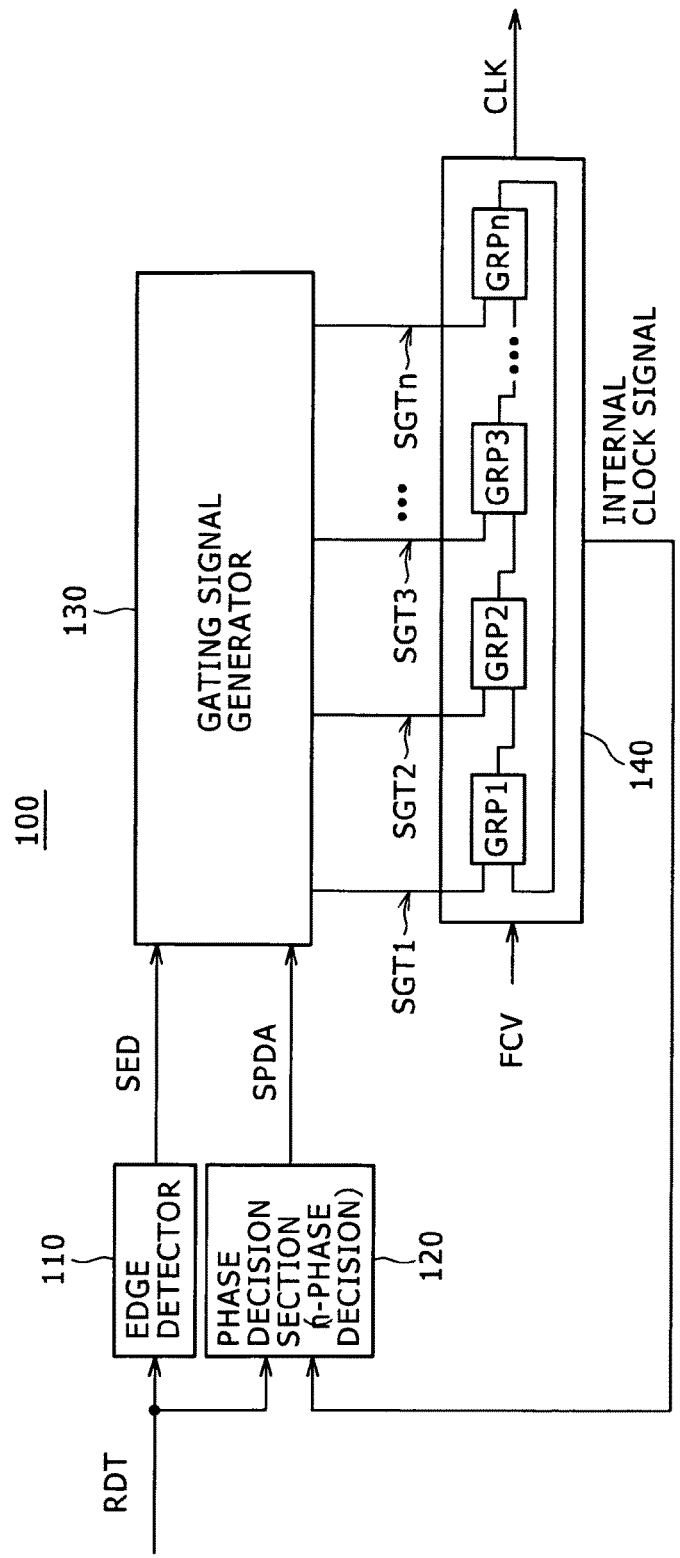
FIG. 3 is a block diagram showing an example of a configuration of a clock regeneration apparatus according to a first embodiment of the present invention.

FIG. 3 shows an example of a configuration of a clock regeneration apparatus according to the first embodiment of the present invention.

Referring to FIG. 3, the clock regeneration apparatus 100 according to the first embodiment includes an edge detector 110, a phase decision section 120, a gating signal generator 130 and a voltage-controlled oscillator (VCO) 140.

The voltage-controlled oscillator 140 is formed from n stages of gating groups GRP1 to GRPn, which form a loop as an oscillation loop.

Further, a gating signal is supplied to each of the gating groups GRP1 to GRPn, and the voltage-controlled oscillator 140 is controlled based on gating signals SGT1 to SGTn to establish phase synchronism.

Further, the oscillation frequency of the voltage-controlled oscillator 140 is controlled based on an oscillation frequency controlling signal FCV so that it becomes equal to 1/n that of a reception data signal RDT.

The voltage-controlled oscillator 140 outputs n clock signals from the output terminals of the gating groups GRP1 to GRPn to regenerate a clock signal CLK of a sub rate synchronized with the reception data signal RDT.

While examples wherein the sub rate is a half rate according to n=2 are hereinafter described, the oscillation frequency of the voltage-controlled oscillator 140 is ½ that of the reception data signal RDT, and the voltage-controlled oscillator 140 regenerates a phase-synchronized clock signal CLK of two phases.

Figure 4:
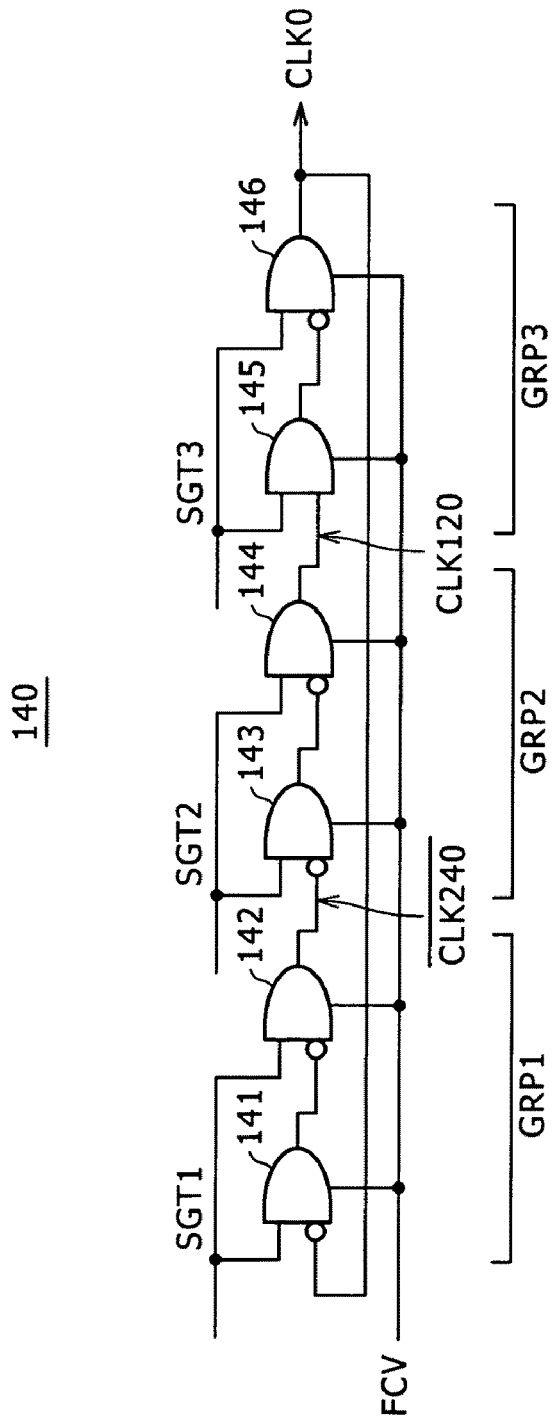
FIG. 4 is a circuit diagram showing an example of a configuration of a voltage-controlled oscillator in the clock regeneration apparatus of FIG. 3 where the number of stages of gating groups is 3.

FIG. 4 shows an example of a configuration of the voltage-controlled oscillator (VCO) according to the present first example where n=3.

Referring to FIG. 4, the voltage-controlled oscillator 140 includes two-input AND gates 141 to 146.

One of two input terminals, that is, a first input terminal, of the five AND gates 141 to 144 and 146 from among the six AND gates 141 to 146 is a negated input terminal.

The AND gate 141 is connected at the first input terminal thereof which is negated input terminal to an output line of the clock signal CLK of the AND gate 146 and at the second input terminal thereof which is a non-negated input terminal to a supply line of the first gating signal SGT1.

The AND gate 142 is connected at the first input terminal thereof which is a negated input terminal to the output terminal of the AND gate 141 and at the second input terminal which is a non-negated input terminal to the supply line of the first gating signal SGT1.

The AND gate 143 is connected at the first input terminal thereof which is a negated input terminal to the output terminal of the AND gate 142 and at the second input terminal which is a non-negated input terminal to a supply line of the second gating signal SGT2.

The AND gate 144 is connected at the first input terminal thereof which is a negated input terminal to the output terminal of the AND gate 143 and at the second input terminal which is a non-negated input terminal to the supply line of the second gating signal SGT2.

The AND gate 145 is connected at the first input terminal thereof which is a non-negated input terminal to the output terminal of the AND gate 144 and at the second input terminal thereof which is a non-negated input terminal to a supply line of the third gating signal SGT3.

The AND gate 146 is connected at the first input terminal thereof which is a negated input terminal to the output terminal of the AND gate 145 and at the second input terminal which is a non-negated input terminal to the supply line of the third gating signal SGT3.

Further, the oscillation frequency controlling signal FCV for controlling the frequency is supplied to the AND gates 141 to 146.

The voltage-controlled oscillator 140 generates a 3-phase phase-synchronized clock signal whose oscillation frequency is ⅓ that of the reception data signal RDT.

Consequently, the oscillation frequency of the voltage-controlled oscillator 140 becomes 1/n the data rate of the reception data signal RDT, and increase of the speed and reduction of the power consumption can be implemented.

The edge detector 110 detects an edge every time an edge of the reception data signal RDT is inputted thereto and outputs an edge detection signal SED.

The phase decision section 120 receives the reception data signal RDT and an output signal of a gating group as inputs thereto, decides the phase of the voltage-controlled oscillator 140 at a point of time of inputting of an edge of the reception data signal RDT and outputs a phase decision signal SPDA.

The phase decision here is particularly to decide, at a point of time at which an edge of the reception data signal RDT is inputted, the position of the edge of the clock signal propagating in the oscillation loop in the voltage-controlled oscillator 140 and which one of rising and falling edges the edge is.

In this instance, the phase decision is to decide, while the edge of the clock signal makes two rounds along the oscillation loop within a period of one cycle, at which position the edge is from among positions where the two rounds are divided into such n positions.

Figure 5:
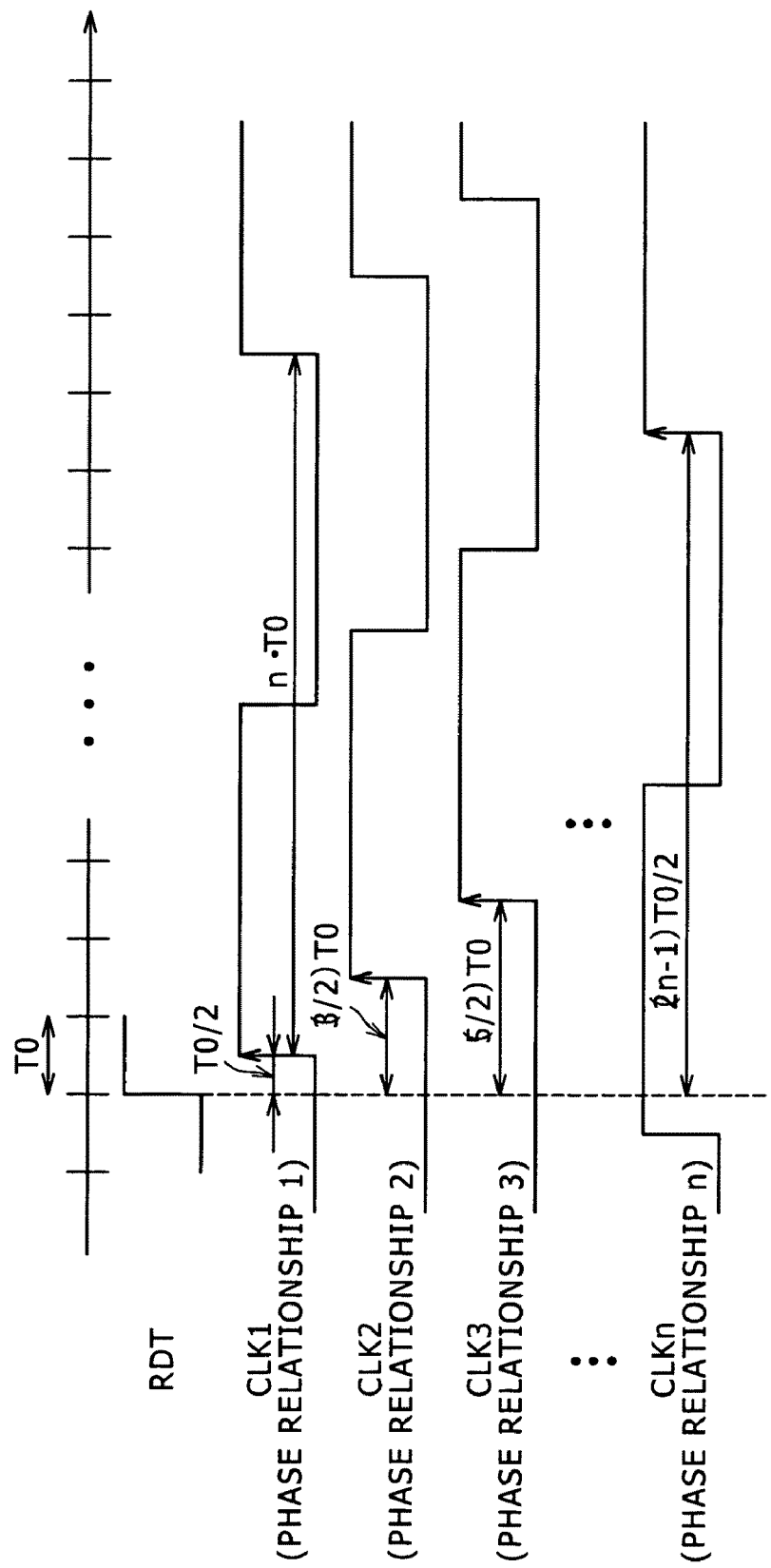
FIG. 5 is a timing chart illustrating a phase relationship between a reception data signal and clock signals of the voltage-controlled oscillator of FIG. 4.

FIG. 5 illustrates a phase relationship between the reception data signal and the clock signal.

The reason why the phase is divided into n positions is such as follows.

In particular, the voltage-controlled oscillator 140 is oscillating in a frequency equal to 1/n the data rate of the reception data signal RDT.

Therefore, the phase relationship between the reception data signal RDT and the clock signal CLK in a steady state in which phase synchronism is maintained has n different cases as seen in FIG. 5 with respect to one edge input of the reception data signal RDT.

Consequently, also the phase relationship between the edge detection signal and the VCO has n different cases.

Therefore, it is necessary to inject the gating signal at an appropriate timing for phase synchronism among the n cases of the position and the rising/falling direction of an edge of the clock signal CLK in the voltage-controlled oscillator 140 at a point of time at which an edge of the reception data signal RDT is inputted.

Therefore, in order to select a gating signal SGT for injecting the edge detection signal SED into the voltage-controlled oscillator 140 and control delay of the gating signal SGT, the phase of the voltage-controlled oscillator 140 at the point of time at which the edge of the reception data signal RDT is inputted is decided. Then, a phase relationship between the reception data signal RDT and the voltage-controlled oscillator 140 is decided.

The phase decision section 120 can be formed, for example, from two flip-flops and a selector.

The phase decision section 120 includes a flip-flop FF which is connected at a clock input terminal thereof to the reception data signal RDT and is connected at a data input terminal thereof to an internal clock signal line of the voltage-controlled oscillator 140. The phase of the voltage-controlled oscillator 140 at the point of time of a rising edge of the reception data signal can be decided by the flip-flop FF.

Similarly, the phase decision section 120 includes another flip-flop which is connected at a clock input terminal thereof to an inverted signal line of the reception data signal RDT and is connected at a data input terminal thereof to the internal clock signal line of the voltage-controlled oscillator 140. The phase of the voltage-controlled oscillator 140 at the point of time of a falling edge of the reception data signal can be decided by the flip-flop.

Further, when the reception data signal has the high level (H), the selector selects an output signal of the flip-flop FF whose clock input terminal is connected to the reception data signal line.

An output signal of the flip-flop which is connected at the clock input terminal thereof to the inverted signal line of the reception data signal when the reception data signal has the low level (L) and the output signal is outputted as the phase decision signal SPDA from the phase decision section 120.

The gating signal generator 130 receives the edge detection signal SED and the phase decision signal SPDA as inputs thereto, selects a gating signal for injecting the edge detection signal SED in response to the phase decision signal SPDA, controls delay of the selected gating signal and outputs resulting gating signals SGT1 to SGTn.

As more particular embodiments, those wherein n=2 are hereinafter described in detail as third to sixth embodiments.

Figure 6:
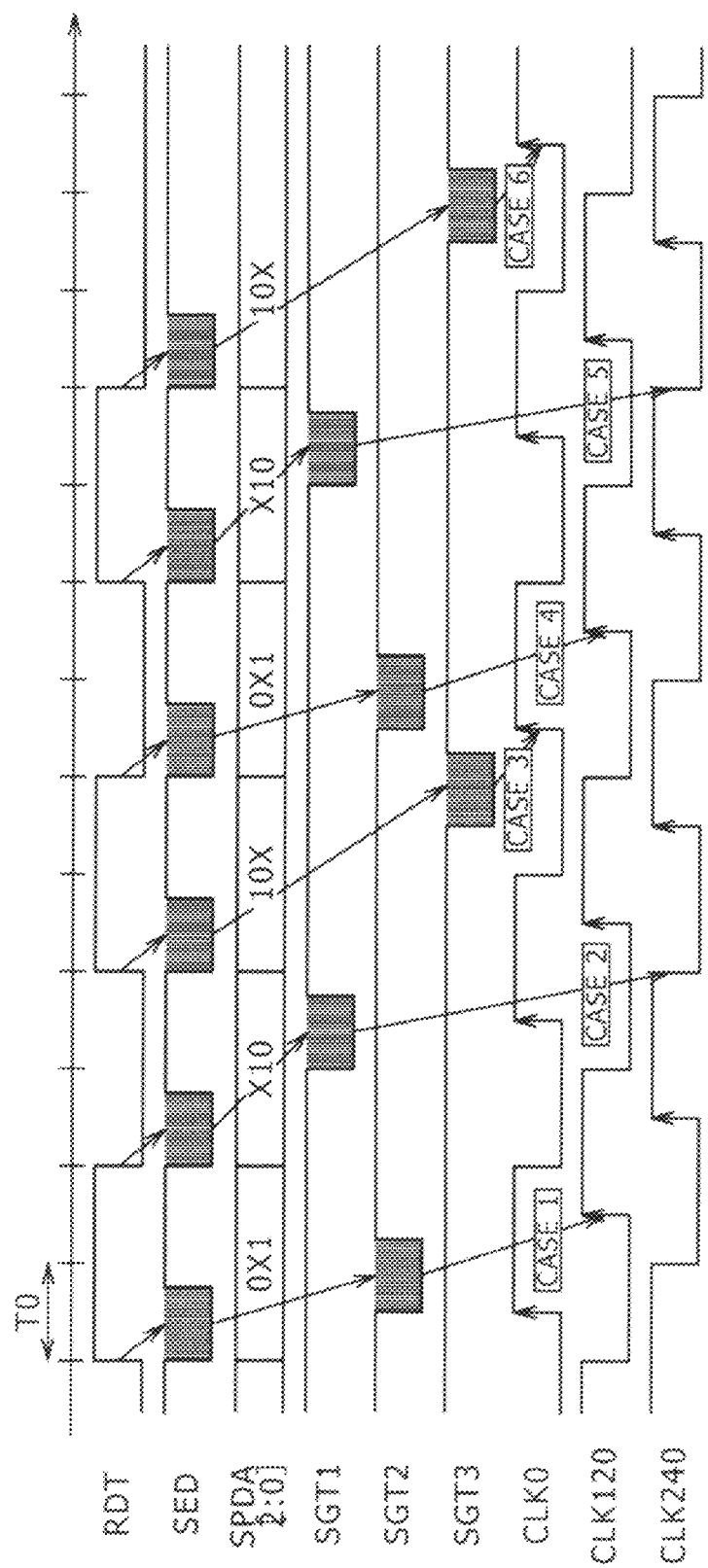
FIG. 6 is a timing chart illustrating an example of operation of the clock regeneration apparatus of FIG. 3 where the number of stages of gating groups is 3.

FIG. 6 illustrates an example of operation of the clock regeneration apparatus of FIG. 3 where n=3.

In FIG. 6, the three-phase clock signals CLK0, CLK120 and CLK240 are regenerated clock signals and have a frequency equal to ⅓ the data rate of the reception data signal.

In the example of operation of FIG. 6, the phase decision section 120 holds the clock signals CLK0, CLK120 and CLK240 for every edge inputting of the reception data signal and outputs them as the phase decision signal SPDA.

Furthermore, the gating signal generator 130 delays, when the phase decision signal SPDA is 0X1, the edge detection signal SED by T0/2 and outputs the delayed edge detection signal SED to the second gating signal SGT2.

Further, when the phase decision signal SPDA is ×10, the gating signal generator 130 delays the edge detection signal SED by T0 and outputs the delayed edge detection signal SED to the gating signal SGT1. When the phase decision signal SPDA is 10×, the gating signal generator 130 delays the edge detection signal SED by (3/2)T0 and outputs the delayed edge detection signal SED to the gating signal SGT3.

The foregoing can be expanded to a case wherein n=4 or more similarly as in the case wherein n=2 and 3.

2. Second Embodiment

Second Sub Rate Configuration

Figure 7:
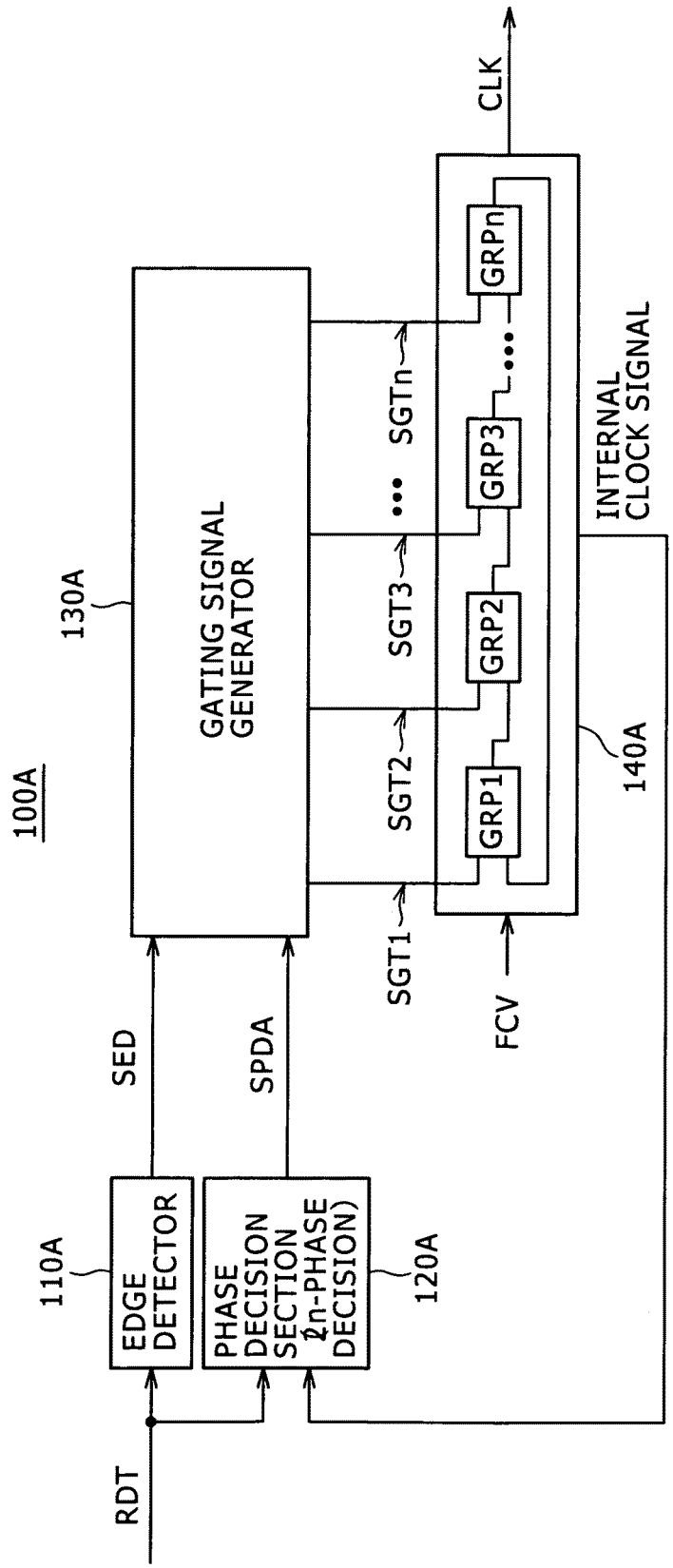
FIG. 7 is a block diagram showing an example of a configuration of a clock regeneration apparatus according to a second embodiment of the present invention.

FIG. 7 shows an example of a configuration of a clock regeneration apparatus according to a second embodiment of the present invention.

Referring to FIG. 7, the clock regeneration apparatus 100A according to the second embodiment is generally configured such that the oscillation frequency of the voltage-controlled oscillator 140A is 1/2n the data rate of the reception data signal RDT.

The clock regeneration apparatus 100A has a basic configuration similar to that of the clock regeneration apparatus 100 according to the first embodiment.

The voltage-controlled oscillator 140A is formed from n stages of gating groups GRP1 to GRPn and configured such that a loop formed from the n stages of gating groups GRP1 to GRPn serves as an oscillation loop.

Further, the gating groups GRP1 to GRPn are individually connected to a gating signal, and the voltage-controlled oscillator 140A is controlled based on gating signals SGT1 to SGTn to carry out phase synchronization.

The oscillation frequency of the voltage-controlled oscillator 140A is controlled so as to be equal to 1/2n that of the reception data signal by an oscillation frequency controlling signal FCV.

The voltage-controlled oscillator 140A outputs 2n clock signals of different phases from output signals of the gating groups GRP1 to GRPn to generate a clock signal CLK of a sub rate synchronized with the reception data signal.

Although a half rate where n=2 is hereinafter described, the oscillation frequency of the voltage-controlled oscillator 140A is ¼ that of the reception data signal RDT, and the voltage-controlled oscillator 140A regenerates four clock signals CLK of different phases synchronized with each other.

Figure 8:
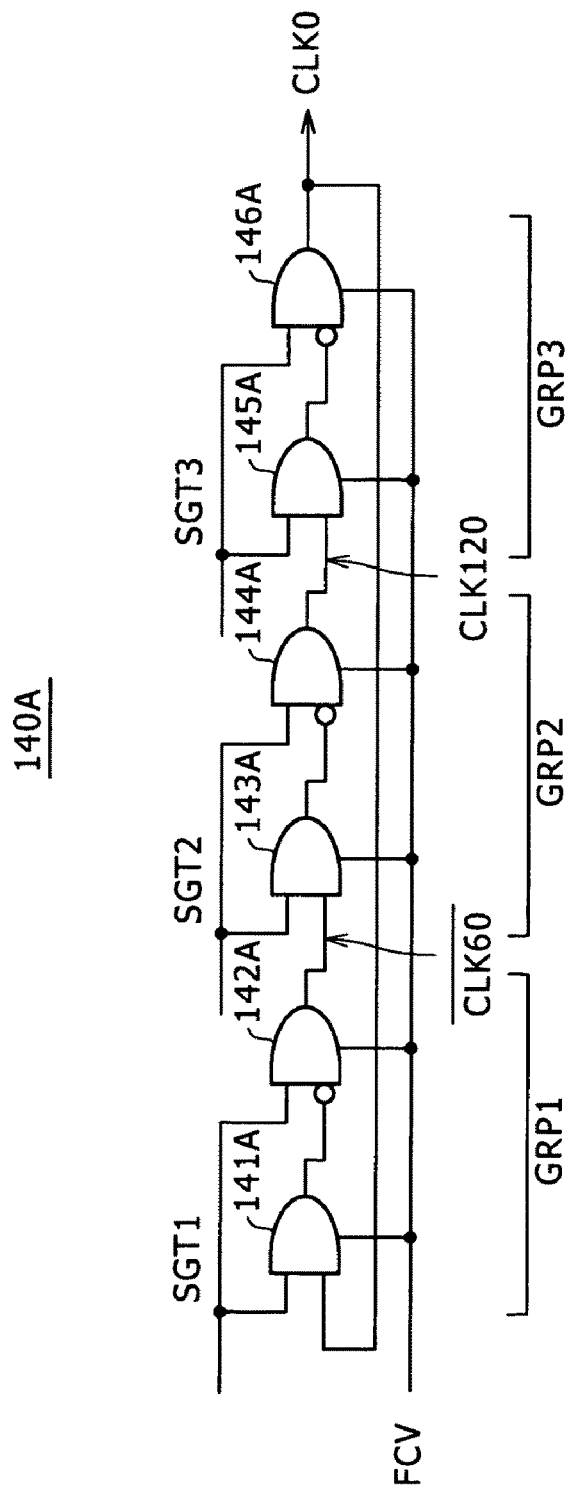
FIG. 8 is a circuit diagram showing an example of a configuration of a voltage-controlled oscillator in the clock regeneration apparatus of FIG. 7 where the number of stages of gating groups is 3.

FIG. 8 shows an example of a configuration of a voltage-controlled oscillator (VCO) where n=3 according to the second embodiment.

Referring to FIG. 8, the voltage-controlled oscillator 140A includes two-input AND gates 141A to 146A.

One of two input terminals, that is, a first input terminal, of each of the three AND gates 142A, 144A and 146A from among the six AND gates 141 to 146 is a negated input terminal.

The AND gate 141A is connected at the first input terminal thereof which is a non-negated input terminal to an output line of the clock signal CLK of the AND gate 146A and at the second input terminal thereof which is a non-negated input terminal to a supply line of the first gating signal SGT1.

The AND gate 142A is connected at the first input terminal thereof which is a negated input terminal to the output terminal of the AND gate 141A and at the second input terminal thereof which is a non-negated input terminal to the supply line of the first gating signal SGT1.

The AND gate 143A is connected at the first input terminal thereof which is a non-negated input terminal to the output terminal of the AND gate 142A and at the second input terminal thereof which is a non-negated input terminal to a supply line of the second gating signal SGT2.

The AND gate 144A is connected at the first input terminal thereof which is a negated input terminal to the output terminal of the AND gate 143A and at the second input terminal thereof which is a non-negated input terminal to the supply line of the second gating signal SGT2.

The AND gate 145A is connected at the first input terminal thereof which is a non-negated input terminal to the output terminal of the AND gate 144A and at the second input terminal thereof which is a non-negated input terminal to a supply line of the third gating signal SGT3.

The AND gate 146A is connected at the first input terminal thereof which is a negated input terminal to the output terminal of the AND gate 145A and at the second input terminal thereof which is a non-negated input terminal to the supply line of the third gating signal SGT3.

Further, an oscillation frequency controlling signal FCV for controlling the frequency is supplied to the AND gates 141A to 146A.

The voltage-controlled oscillator 140A regenerates six clock signals of different phases synchronized with each other and having a frequency equal to ⅓ that of the reception data signal RDT.

Consequently, the oscillation frequency of the voltage-controlled oscillator 140A becomes 1/2n the data rate of the reception data signal RDT, and high speed operation and low power consumption can be implemented.

An edge detector 110A detects an edge every time an edge of the reception data signal RDT is inputted and outputs an edge detection signal SED.

A phase decision section 120A receives the reception data signal RDT and output signals of the gating groups as inputs thereto, decides the phase of the voltage-controlled oscillator 140A at a point of time at which an edge of the reception data signal RDT is inputted, and outputs a phase decision signal SPDA.

The phase decision here is particularly to decide, at a point of time at which an edge of the reception data signal RDT is inputted, the position of the edge of the clock signal propagating in the oscillation loop in the voltage-controlled oscillator 140 and which one of rising and falling edges the edge is.

In this instance, the phase decision is to decide, while the edge of the clock signal makes two rounds along the oscillation loop within a period of one cycle, at which position the edge is from among positions where the two rounds are divided into such 2n positions.

The reason why the phase is divided equally into 2n positions is such as follows.

In particular, the voltage-controlled oscillator 140A is oscillating in a frequency equal to 1/2n the data rate of the reception data signal.

Therefore, the phase relationship between the reception data signal and the clock signal in a steady state in which phase synchronism is maintained has 2n different cases with respect to one edge input of the reception data signal RDT.

Consequently, also the phase relationship between the edge detection signal SED and the voltage-controlled oscillator 140A has 2n different cases.

Therefore, it is necessary to inject the gating signal at an appropriate timing for phase synchronism among the 2n cases of the position and the rising/falling direction of an edge of the clock signal CLK in the voltage-controlled oscillator 140A at a point of time at which an edge of the reception data signal RDT is inputted.

Therefore, in order to select a gating signal SGT for injecting the edge detection signal SED into the voltage-controlled oscillator 140A and control delay of the gating signal SGT, the phase of the voltage-controlled oscillator 140A at the point of time at which the edge of the reception data signal RDT is inputted is decided. Then, a phase relationship between the reception data signal RDT and the voltage-controlled oscillator 140A is decided.

The phase decision section 120A can be formed, for example, from two flip-flops and a selector.

The phase decision section 120A includes a flip-flop FF which is connected at a clock input terminal thereof to the reception data signal line and is connected at a data input terminal thereof to an internal clock signal line of the voltage-controlled oscillator 140A. The phase of the voltage-controlled oscillator 140A at the point of time of a rising edge of the reception data signal can be decided by the flip-flop FF.

Similarly, the phase decision section 120A includes another flip-flop which is connected at a clock input terminal thereof to an inverted signal line of the reception data signal RDT and is connected at a data input terminal thereof to the internal clock signal line of the voltage-controlled oscillator 140A. The phase of the voltage-controlled oscillator 140A at the point of time of a falling edge of the reception data signal can be decided by the flip-flop.

Further, when the reception data signal RDT has the high level (H), the selector selects an output signal of the flip-flop FF whose clock input terminal is connected to the reception data signal line.

An output signal of the flip-flop which is connected at a clock input terminal thereof to the inverted signal line of the reception data signal is selected by the selector when the reception data signal has the low level (L) and is outputted as the phase decision signal SPDA from the phase decision section 120A.

The gating signal generator 130A receives the edge detection signal SED and the phase decision signal SPDA as inputs thereto, selects a gating signal for injecting the edge detection signal SED in response to the phase decision signal SPDA, controls delay of the selected gating signal and outputs resulting gating signals SGT1 to SGTn.

Figure 9:
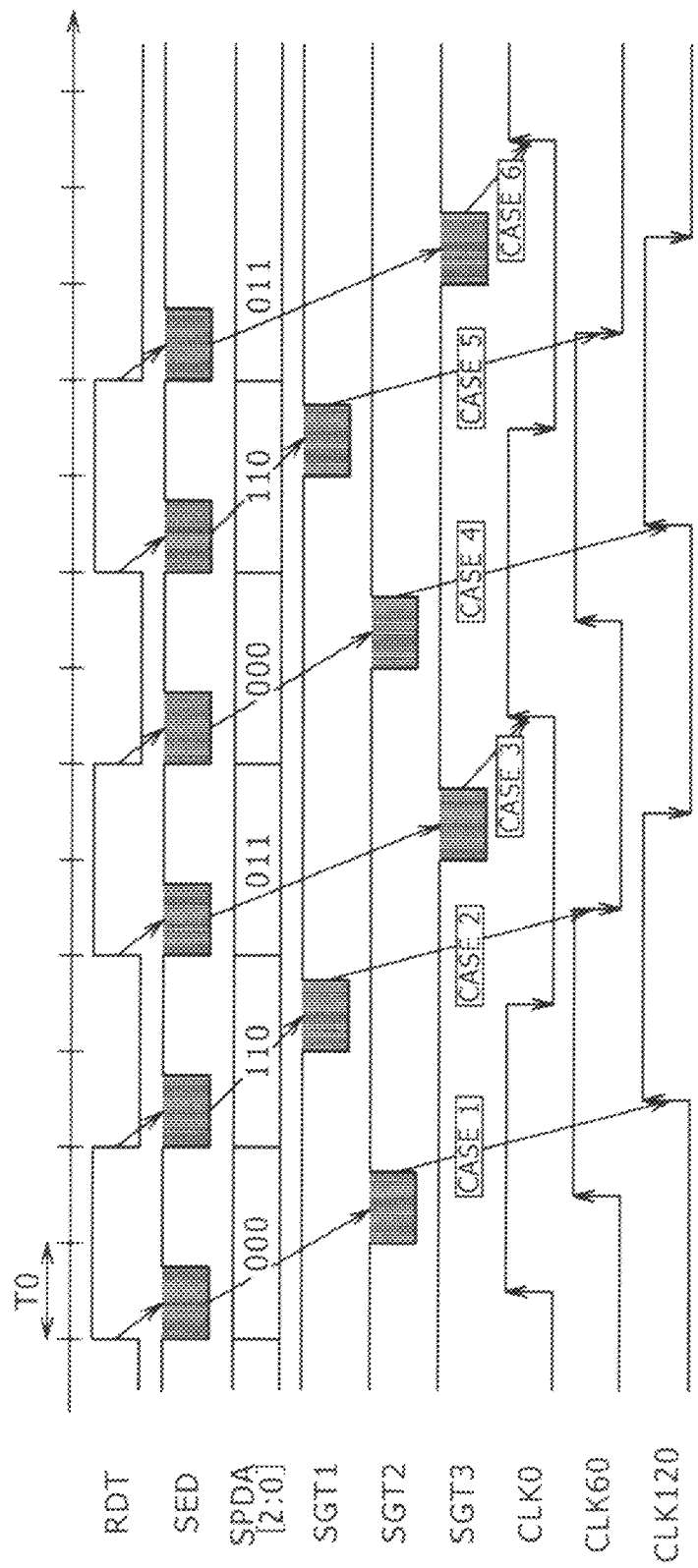
FIG. 9 is a timing chart illustrating an example of operation of the clock regeneration apparatus of FIG. 7 where the number of stages of gating groups is 3.

FIG. 9 illustrates an example of operation of the clock regeneration apparatus of FIG. 7 where n=3.

In FIG. 9, six-phase clock signals including the three-phase clock signals CLK0, CLK60 and CLK120 and inverted signals of them are regenerated clock signals and have a frequency equal to 1/6 the data rate of the reception data signal.

In the example of operation of FIG. 9, the phase decision section 120A holds the clock signals CLK0, CLK60 and CLK120 for every edge inputting of the reception data signal and outputs them as the phase decision signal SPDA.

Furthermore, the gating signal generator 130A delays, when the phase decision signal SPDA is 000, the edge detection signal by T0 and outputs the delayed edge detection signal to the gating signal SGT2.

Further, when the phase decision signal SPDA is 110, the gating signal generator 130A delays the edge detection signal SED by T0 and outputs the delayed edge detection signal SED to the gating signal SGT1. When the phase decision signal SPDA is 011, the gating signal generator 130A delays the edge detection signal SED by T0 and outputs the delayed edge detection signal SED to the gating signal SGT3.

The foregoing can be expanded to a case wherein n=4 or more similarly as in the case wherein n=2 or 3.

In the following, embodiments of a clock regeneration apparatus which regenerate a clock signal of a half rate are described. It is to be noted that the present invention is not limited to the half rate but allows such expansion as described hereinabove, that is, to a sub rate. Further, while a configuration for a single signal is described, a configuration for differential signals may be used instead.

3. Third Embodiment

Figure 10:
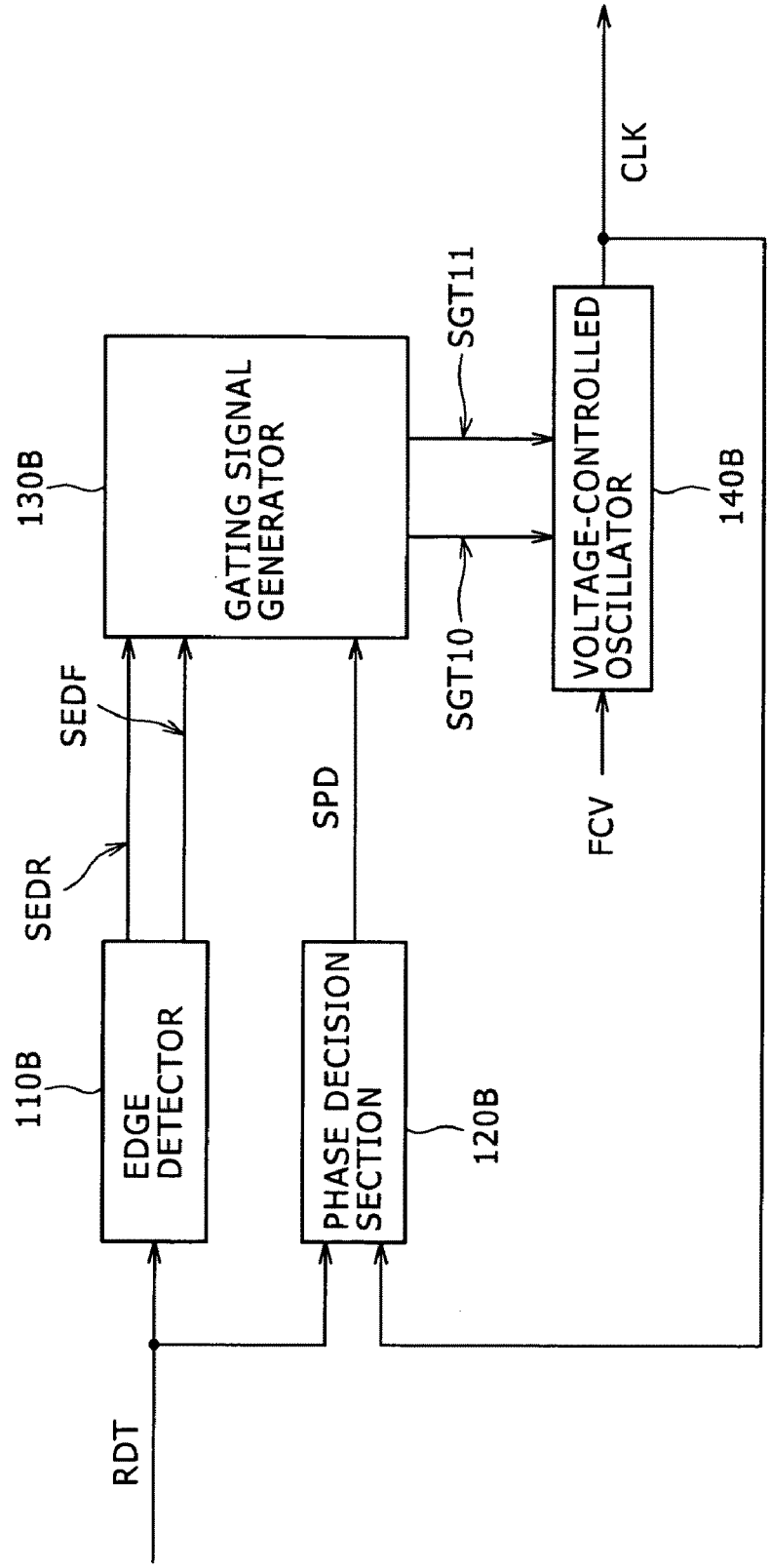
FIG. 10 is a block diagram showing an example of a configuration of a clock regeneration apparatus according to a third embodiment of the present invention.

FIG. 10 shows an example of a configuration of a clock regeneration apparatus according to a third embodiment of the present invention.

Referring to FIG. 10, the clock regeneration apparatus 100B according to the third embodiment includes an edge detector 110B, a phase decision section 120B, a gating signal generator 130B and a voltage-controlled oscillator 140B.

The edge detector 110B detects a rising edge of a reception data signal RDT to produce a rising edge detection signal SEDR representative of presence or absence of a rising edge and detects a falling edge of the reception data signal RDT to generate a falling edge detection signal SEDF representative of presence or absence of a falling edge.

The edge detector 110B outputs the rising edge detection signal SEDR and the falling edge detection signal SEDF generated thereby to the gating signal generator 130B.

Figure 11:
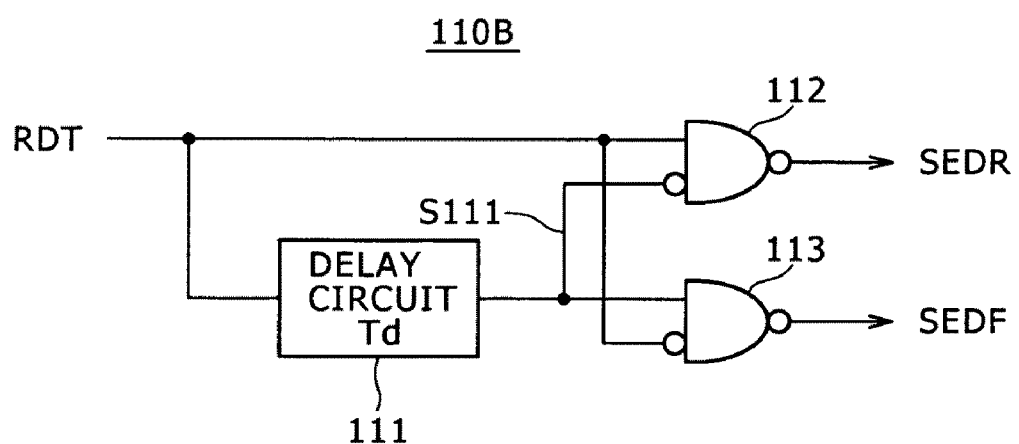
FIG. 11 is a block diagram showing an example of a configuration of an edge detector shown in FIG. 10.

FIG. 11 shows an example of a configuration of the edge detector of the clock regeneration apparatus according to the third embodiment.

FIGS. 12A to 12D illustrate operation timings of the edge detector of FIG. 11.

Figure 12:
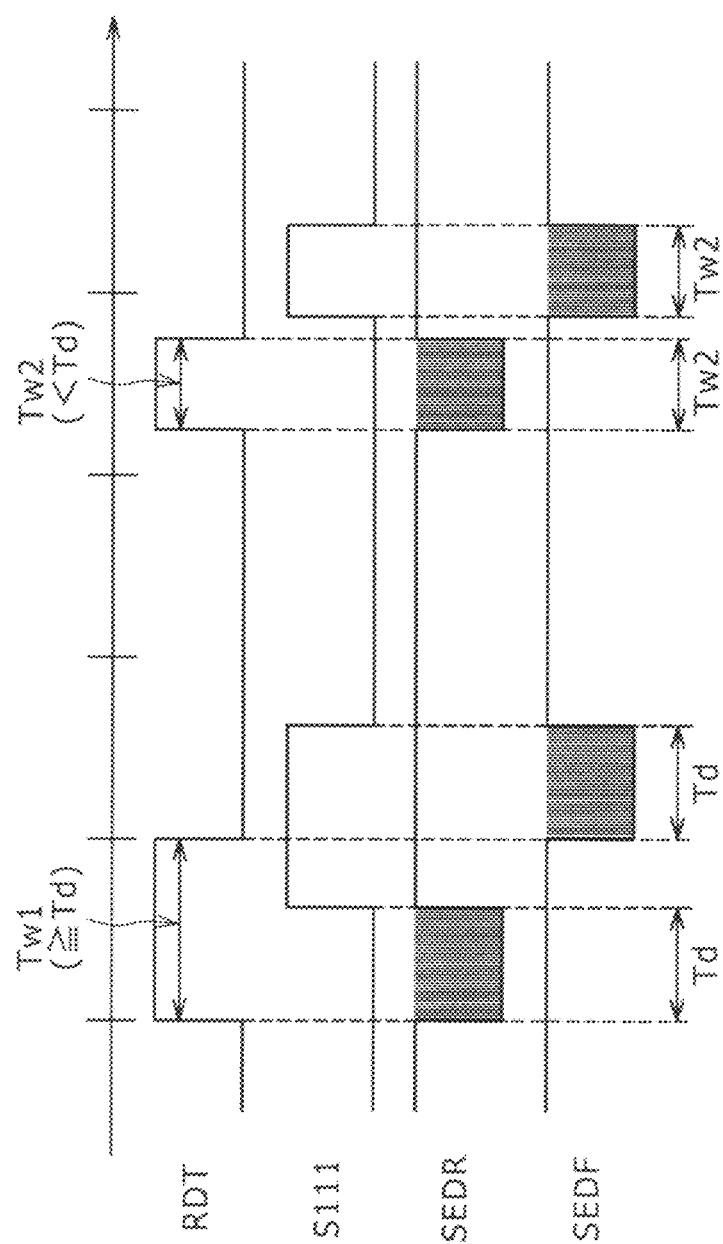
FIGS. 12A to 12D are timing charts illustrating operation timings of the edge detector of FIG. 11.

In particular, FIG. 12A illustrates the reception data signal RDT; FIG. 12B a delay signal S111; FIG. 12C the rising edge detection signal SEDR; and FIG. 12D the falling edge detection signal SEDF.

Referring first to FIG. 11, the edge detector 110B includes a delay circuit 111 and a pair of two-input NAND gates 112 and 113.

The delay circuit 111 delays the reception data signal RDT by time Td and outputs the delayed reception data signal as the delay signal S111 to the NAND gates 112 and 113.

The delay time Td of the delay circuit 111 is set to a value shorter than the period T0 of the reception data signal RDT (Td<T0).

The NAND gate 112 has a first input terminal to which the reception data signal RDT is supplied and a second input terminal formed as a negated input terminal to which the delay signal S111 is supplied.

The NAND gate 113 has a first input terminal to which the delay signal S111 is supplied and a second input terminal formed as a negated input terminal to which the reception data signal RDT is supplied.

Where the amount of jitters in the reception data signal RDT is small and the distance Tw1 between adjacent edges of the reception data signal RDT is greater than the time Td, the edge detector 110B operates in the following manner.

The edge detector 110B outputs a pulse signal which exhibits the low level only within a period of the time Td for each edge as seen in FIGS. 12C and 12D as a rising edge detection signal SEDR or a falling edge detection signal SEDF from the NAND gates 112 and 113, respectively.

Meanwhile, where the distance TW2 between adjacent edges is shorter than the time Td due to jitters, the edge detector 110B operates in the following manner.

The edge detector 110B outputs a pulse signal which exhibits the low level (L) only within the period Tw2 for every edge as seen in FIGS. 12C and 12D from the NAND gates 112 and 113 as the rising edge detection signal SEDR and the falling edge detection signal SEDF, respectively.

In this manner, in the edge detector 110B shown in FIG. 11, a circuit for detecting a rising edge and a circuit for detecting a falling edge are separated from each other.

Further, since a rising edge and a falling edge appear alternately with the reception data signal RDT and one of the edges does not appear successively, even if adjacent edges approach each other by jitters, the edge detector 110B can detect the edges.

The phase decision section 120B decides the phase of the clock signal CLK which is an output of the voltage-controlled oscillator 140B for every edge of the reception data signal RDT and outputs a result of the decision as a phase decision signal SPD to the gating signal generator 130B.

Figure 13:
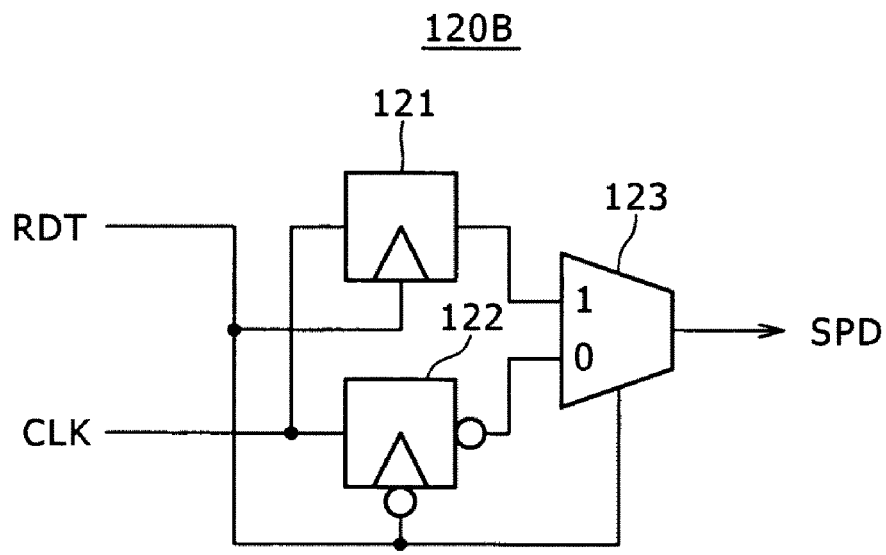
FIG. 13 is a block diagram showing an example of a configuration of a phase decision section shown in FIG. 10.

FIG. 13 shows an example of a configuration of the phase decision section of the clock regeneration apparatus in the present third embodiment.

Referring to FIG. 13, the phase decision section 120B includes a pair of flip-flops 121 and 122, and a selector 123.

The flip-flop 121 serves as a first latch and carries out fetching and outputting of the clock signal CLK outputted from the voltage-controlled oscillator 140 in synchronism with an edge of the reception data signal RDT.

The flip-flop 122 serves as a second latch and carries out fetching of the clock signal CLK outputted from the voltage-controlled oscillator 140B in synchronism with an inverted signal of an edge of the reception data signal RDT and outputting of an inverted signal of the fetched clock signal.

The selector 123 selects an output signal of the flip-flop 121 and outputs the selected signal as a phase decision signal SPD within a period within which the reception data signal RDT exhibits the high level.

The selector 123 selects an output signal of the flip-flop 122 and outputs the selected signal as a phase decision signal SPD within a period within which the reception data signal RDT exhibits the low level.

The phase decision section 120B shown in FIG. 13 holds the value of the clock signal CLK by means of the flip-flops 121 and 122 for each edge of the reception data signal RDT and selects and outputs one of the values held in the flip-flops 121 and 122.

Consequently, the phase decision section 120B decides the phase of the clock signal CLK at a point of time at which an edge of the reception data signal RDT is inputted and outputs the decided phase as a phase decision signal SPD.

It is to be noted that, while the holding section is formed from the flip-flops 121 and 122, only it is necessary for the holding section to function as a latch, and the holding section need not be a flip-flop.

The gating signal generator 130B selects one of the rising edge detection signal SEDR and the falling edge detection signal SEDF in response to the phase decision signal SPD.

Then, the gating signal generator 130B delays the selected signal and outputs the delayed signal as a first gating signal SGT10 and a second gating signal SGT11 to be injected into the voltage-controlled oscillator 140B to the voltage-controlled oscillator 140B.

Figure 14:
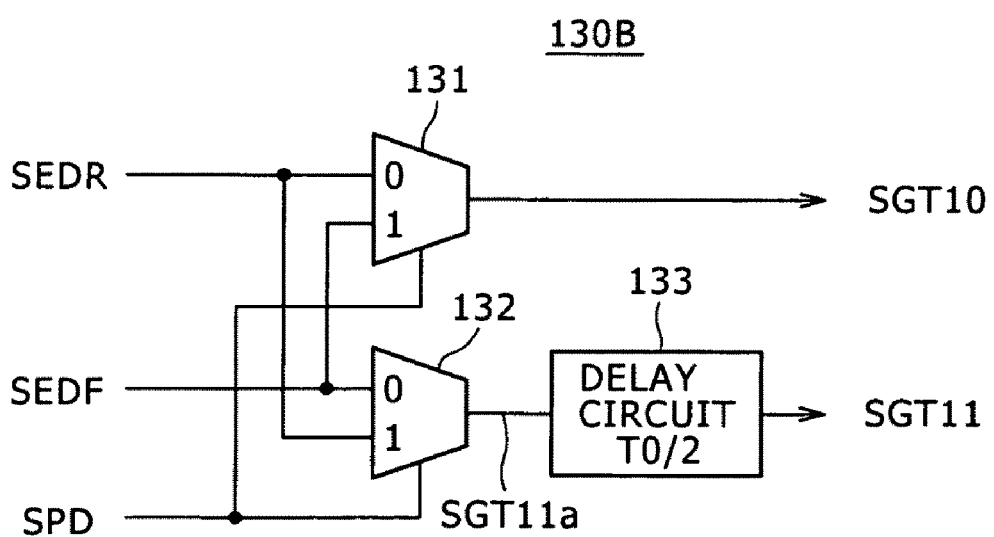
FIG. 14 is a circuit diagram showing an example of a configuration of a gating signal generator shown in FIG. 10.

FIG. 14 shows an example of a configuration of the gating signal generator of the clock regeneration apparatus 100B according to the present third embodiment.

Referring to FIG. 14, the gating signal generator 130B shown includes a pair of selectors 131 and 132 and a delay circuit 133.

The selector 131 is connected at the input terminal "0" thereof to a supply line of the rising edge detection signal SEDR and at the input terminal "1" thereof to the supply line of the falling edge detection signal SEDF.

The selector 132 is connected at the input terminal "0" thereof to a supply line of the falling edge detection signal SEDF and at the input terminal "1" thereof to the supply line of the rising edge detection signal SEDR.

The selectors 131 and 132 select the input terminal "0" side thereof and outputs the signal inputted to the same when the phase decision signal SPD from the phase decision section 120B has the low level.

In particular, when the phase decision signal SPD has the low level, the selector 131 outputs the rising edge detection signal SEDR as the first gating signal SGT10.

Further, when the phase decision signal SPD has the low level, the selector 132 outputs the falling edge detection signal SEDF as a second gating signal SGT11a.

On the other hand, when the phase decision signal SPD from the phase decision section 120B has the high level, the selectors 131 and 132 select the input terminal "1" side thereof and output the signal inputted to the same.

In particular, when the phase decision signal SPD has the high level, the selector 131 outputs the falling edge detection signal SEDF as a first gating signal SGT10.

Further, when the phase decision signal SPD has the high level, the selector 132 outputs the rising edge detection signal SEDR as a second gating signal SGT11a.

The delay circuit 133 delays the second gating signal SGT11a outputted from the selector 132 by one half cycle (T0/2) of the reception data signal RDT and outputs the delayed second gating signal SGT11a as the second gating signal SGT11.

The gating signal generator 130B of FIG. 10 selects one of the rising edge detection signal SEDR and the falling edge detection signal SEDF in response to the phase decision signal SPD and outputs the first gating signal SGT10 or the second gating signal SGT11.

Further, the second gating signal SGT11 is outputted as a signal delayed by T0/2 by the delay circuit 133.

The voltage-controlled oscillator 140B outputs the clock signal CLK in synchronism with an edge injected by injecting one of the first and second gating signals SGT10 and SGT11 as a signal or information representative of edge detection into the oscillation loop in the voltage-controlled oscillator 140.

Further, the oscillation frequency of the voltage-controlled oscillator 140B is controlled based on the oscillation frequency controlling signal FCV.

The voltage-controlled oscillator 140B outputs the clock signal CLK of the controlled oscillation frequency within a period within which a signal representative of edge detection given by any of the first and second gating signals SGT10 and SGT11 is not injected into the voltage-controlled oscillator 140B.

Figure 15:
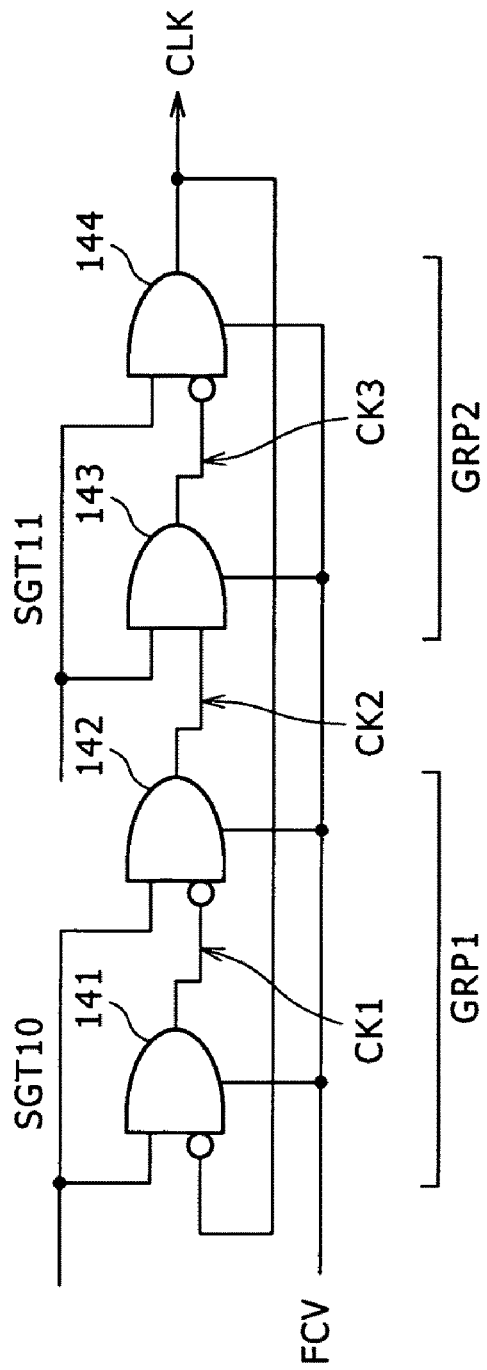
FIG. 15 is a circuit diagram showing an example of a configuration of a voltage-controlled oscillator shown in FIG. 10.

FIG. 15 shows an example of a configuration of the voltage-controlled oscillator of the clock regeneration apparatus 100B according to the third embodiment of the present invention.

Referring to FIG. 15, the voltage-controlled oscillator 140B shown includes four two-input AND gates 141 to 144.

One of two input terminals, that is, a first input terminal, of each of the three AND gates 141, 142 and 144 from among the four AND gates 141 to 144 is a negated input terminal.

The AND gate 141 is connected at the first input terminal thereof which is a negated input terminal to an output line of the clock signal CLK of the AND gate 144 and at the second input terminal thereof which is a non-negated input terminal to a supply line of the first gating signal SGT10.

The AND gate 142 is connected at the first input terminal thereof which is a negated input terminal to the output terminal of the AND gate 141 and at the second input terminal thereof which is a non-negated input terminal to the supply line of the first gating signal SGT10.

The AND gate 143 is connected at the first input terminal thereof which is a non-negated input terminal to the output terminal of the AND gate 142 and at the second input terminal thereof which is a non-negated input terminal to a supply line of the second gating signal SGT11.

The AND gate 144 is connected at the first input terminal thereof which is a negated input terminal to the output terminal of the AND gate 143 and at the second input terminal thereof which is a non-negated input terminal to the supply line of the second gating signal SGT11.

Further, an oscillation frequency controlling signal FCV for controlling the frequency is supplied to the AND gates 141 to 144.

The voltage-controlled oscillator 140B is configured such that it is possible to regenerate the clock signal CLK of a half rate synchronized with the reception data signal RDT.

Corresponding to this, the four AND gates 141 to 144 are grouped into two groups including a first gating group GRP1 of the two AND gates 141 and 142 at a preceding stage and a second gating group GRP2 of the two AND gates 143 and 144 at a succeeding stage.

The first gating signal SGT10 is supplied to the first gating group GRP1 and the second gating signal SGT11 is supplied to the second gating group GRP2.

The AND gate 141 outputs the first internal clock signal CK1 to the first input terminal which is a negated input terminal of the AND gate 142 at the succeeding stage.

The AND gate 142 outputs the second internal clock signal CK2 to the first input terminal which is a non-negated input terminal of the AND gate 143 at the succeeding stage.

The AND gate 143 outputs the third internal clock signal CK3 to the first input terminal which is a negated input terminal of the AND gate 144.

The voltage-controlled oscillator 140B of FIG. 15 outputs the clock signal CLK whose frequency is controlled based on the oscillation frequency controlling signal FCV and whose phase is controlled based on the first gating signal SGT10 and the second gating signal SGT11.

In the voltage-controlled oscillator 140B, when both of the first and second gating signals SGT10 and SGT11 have the high level (H), an oscillation loop is formed internally and continues to oscillate.

On the other hand, where the first gating signal SGT10 has the low level (L), both of the first internal clock signal CK1 by the AND gate 141 and the second internal clock signal CK2 by the AND gate 142 have the low level (L).

Then, if the level of the first gating signal SGT10 changes to the high level (H), then the second internal clock signal CK2 is brought into the high level (H) in synchronism with the first gating signal SGT10.

Further, a falling edge synchronized with the clock signal CLK after delay by T0/2 appears with the second internal clock signal CK2.

Similarly, when the level of the second gating signal SGT11 changes from the low level (L) to the high level (H), the clock signal CLK changes to the high level in synchronism with the second gating signal SGT11. Then, a rising edge synchronized with the clock signal CLK without being delayed appears with the clock signal CLK.

FIGS. 16A to 16G illustrate an example of operation of the clock regeneration apparatus of the present third embodiment.

Figure 16:
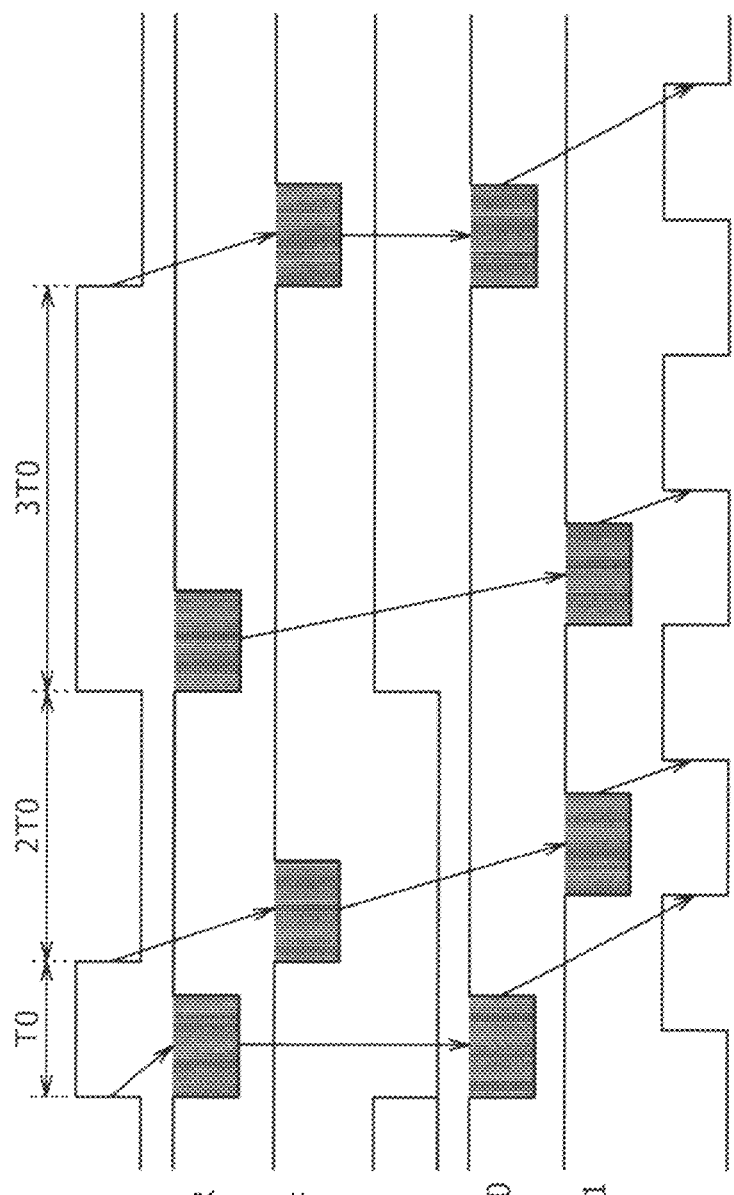
FIGS. 16A to 16G are timing charts illustrating an example of operation of the clock regeneration apparatus of FIG. 10.

In particular, FIG. 16A illustrates the reception data signal RDT; FIG. 16B the rising edge detection signal SEDR; FIG. 16C the falling edge detection signal SEDF; and FIG. 16D the phase decision signal SPD. FIG. 16E illustrates the first gating signal SGT10; FIG. 16F the second gating signal SGT11; and FIG. 11G the clock signal CLK.

Now, operation of the clock regeneration apparatus 100B of the third embodiment is described with reference to FIGS. 16A to 16G.

The reception data signal RDT is inputted to the edge detector 110B and the phase decision section 120B.

The edge detector 110B detects a rising edge of the reception data signal RDT and generates a rising edge detection signal SEDR representative of presence or absence of a rising edge.

Similarly, the edge detector 110B detects a falling edge of the reception data signal RDT and generates a falling edge detection signal SEDF representative of presence or absence of a falling edge.

The rising edge detection signal SEDR and the falling edge detection signal SEDF generated by the edge detector 110B are outputted to the gating signal generator 130B.

The phase decision section 120B decides a phase of the clock signal CLK outputted from the voltage-controlled oscillator 140B for each edge of the reception data signal RDT and outputs a result of the decision as a phase decision signal SPD to the gating signal generator 130B.

The gating signal generator 130B selects one of the rising edge detection signal SEDR and the falling edge detection signal SEDF in response to the phase decision signal SPD from the phase decision section 120B.

Then, the gating signal generator 130B delays the selected signal and outputs the delayed signal as the first gating signal SGT10 and the second gating signal SGT11 to be injected into the voltage-controlled oscillator 140B to the voltage-controlled oscillator 140B.

In the voltage-controlled oscillator 140B, one of the first and second gating signals SGT10 and SGT11 is injected as a signal or information representative of edge detection into the oscillation loop in the voltage-controlled oscillator 140B. Consequently, the clock signal CLK is synchronized with the edge injected by the voltage-controlled oscillator 140B and is outputted.

The oscillation frequency of the voltage-controlled oscillator 140B is controlled based on the oscillation frequency controlling voltage FCV.

Further, in the voltage-controlled oscillator 140B, within a period within which a signal representative of edge detection is not injected by the first and second gating signals SGT10 and SGT11, the clock signal CLK of the oscillation frequency controlled based on the oscillation frequency controlling voltage FCV is outputted.

In the operation described above, the clock signal CLK is outputted as a clock pulse while the phase thereof is synchronized with the reception data signal RDT for each edge of the reception data signal RDT as seen from FIGS. 16A to 16G.

Further, edge injection into the voltage-controlled oscillator 140B can be carried out from a plurality of locations, and a rising edge is synchronized with the injection from at least one place and a falling edge is synchronized with the injection from at least one other place.

Consequently, it is possible to regenerate a clock signal CLK of a half rate synchronized with the reception data signal RDT.

4. Fourth Embodiment

Figure 17:
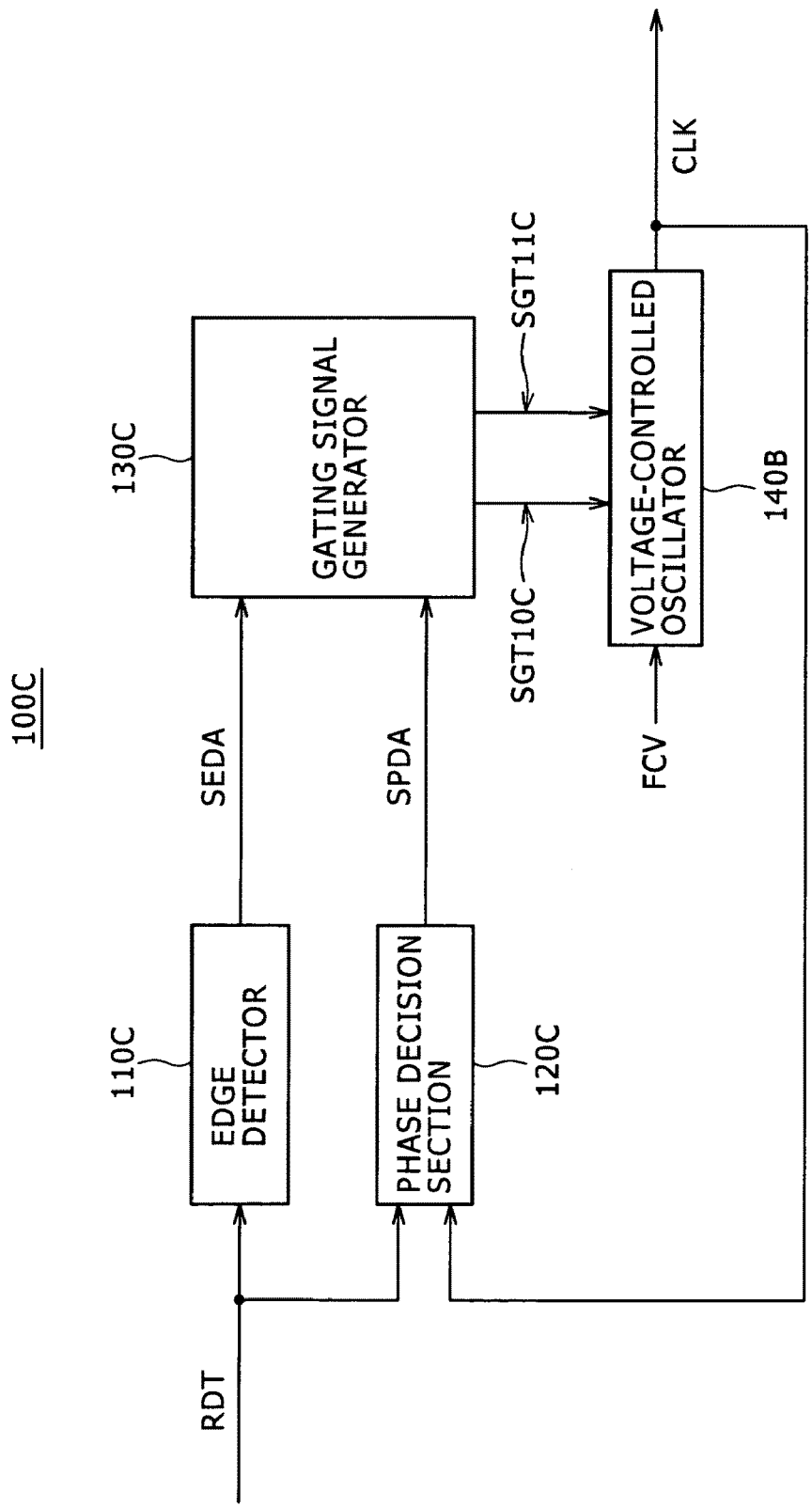
FIG. 17 is a block diagram showing an example of a configuration of a clock regeneration apparatus according to a fourth embodiment of the present invention.

FIG. 17 shows an example of a configuration of a clock regeneration apparatus according to a fourth embodiment of the present invention.

Referring to FIG. 17, the clock regeneration apparatus 100C according to the present fourth embodiment is similar to the clock regeneration apparatus 100B according to the third embodiment described hereinabove except in configuration of an edge detector 110C, a phase decision section 120C and a gating signal generator 130C.

Figure 18:
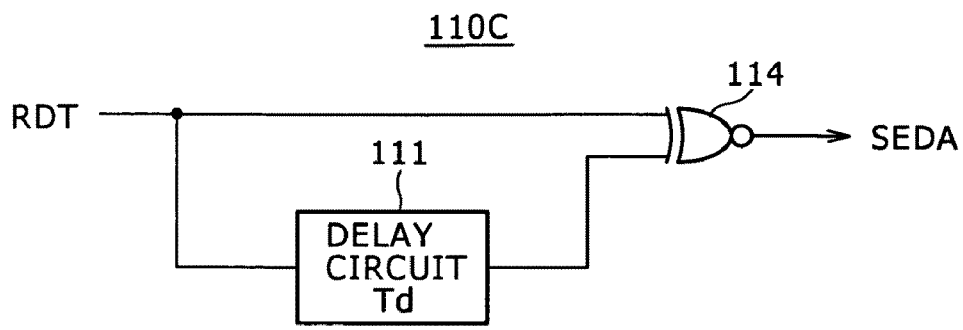
FIG. 18 is a circuit diagram showing an example of a configuration of an edge detector shown in FIG. 17.

FIG. 18 shows an example of a configuration of the edge detector 110C in the clock regeneration apparatus 100C of the fourth embodiment.

Referring to FIG. 18, the edge detector 110C shown includes a delay circuit 111 and an exclusive OR (EXOR) gate 114.

The EXOR gate 114 is connected at the first input terminal thereof to an input line of the reception data signal RDT and at the second input terminal thereof to an output terminal of the delay circuit 111.

The edge detector 110C detects a rising edge and a falling edge by means of the single EXOR gate 114 as seen in FIG. 18 and outputs a result of the detection as an edge detection signal SEDA to the gating signal generator 130C.

In this instance, the circuit area and the power consumption of the edge detector 110C of FIG. 18 can be reduced in comparison with the edge detector 110B in the third embodiment shown in FIG. 11.

Figure 19:
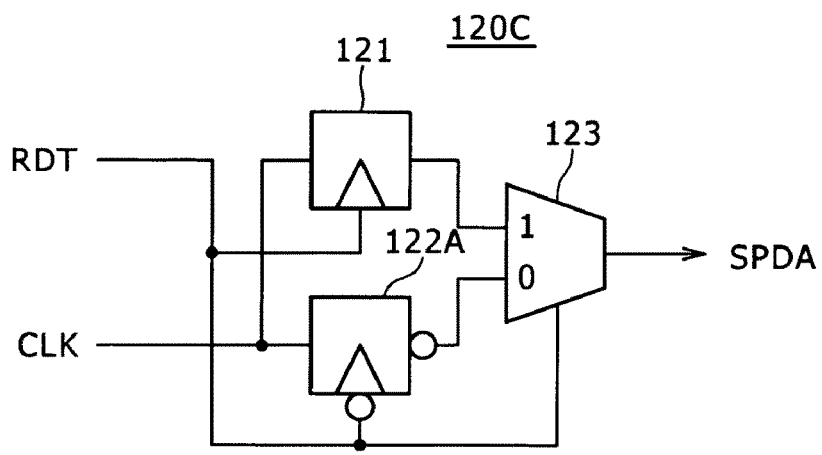
FIG. 19 is a circuit diagram showing an example of a configuration of a phase decision section shown in FIG. 17.

FIG. 19 shows an example of a configuration of the phase decision section in the present fourth embodiment.

Referring to FIG. 19, the phase decision section 120C shown includes a pair of flip-flops 121 and 122A and a selector 123.

The flip-flop 121 fetches and outputs the clock signal CLK outputted from the voltage-controlled oscillator 140B in synchronism with an edge of the reception data signal RDT.

The flip-flop 122A fetches and outputs the clock signal CLK outputted from the voltage-controlled oscillator 140B in synchronism with an inverted signal of an edge of the reception data signal RDT.

The selector 123 selects the output signal of the flip-flop 121 within a period within which the reception data signal RDT has the high level and outputs the selected signal as the phase decision signal SPDA.

The selector 123 selects the output signal of the flip-flop 122A within a period within which the reception data signal RDT has the low level and outputs the selected signal as the phase decision signal SPDA.

The phase decision section 120C of FIG. 19 retains values of the clock signal CLK into the flip-flops 121 and 122A for each edge of the reception data signal RDT, selects one of the values of the flip-flops 121 and 122A by means of the selector 123 and outputs the selected value similarly to the phase decision section 120B of FIG. 13 described hereinabove.

Consequently, the phase decision section 120C decides the phase of the clock signal CLK at a point of time at which an edge of the reception data signal RDT is inputted and outputs the decided phase as the phase decision signal SPDA.

Figure 20:
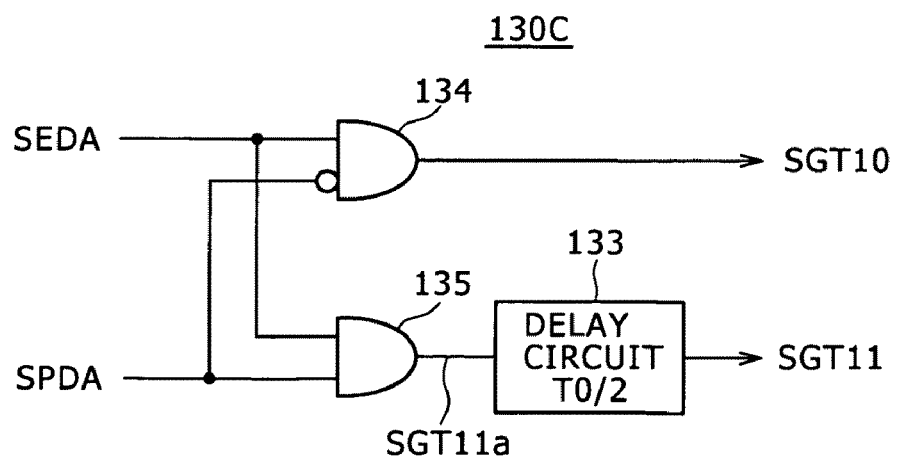
FIG. 20 is a circuit diagram showing an example of a configuration of a gating signal generator shown in FIG. 17.

FIG. 20 shows an example of a configuration of the gating signal generator 130C in the present fourth embodiment.

Referring to FIG. 20, the gating signal generator 130C shown includes a delay circuit 133 and a pair of two-input AND circuits 134 and 135.

The AND circuit 134 is connected at the first input terminal thereof to a supply line of the edge detection signal SEDA and at the second input terminal thereof which is a negated input terminal to a supply line of the phase decision signal SPDA.

A first gating signal SGT10 is outputted from the output terminal of the AND circuit 134.

The AND circuit 135 is connected at the first input terminal thereof to the supply line of the edge detection signal SEDA and at the second input terminal thereof to the supply line of the phase decision signal SPDA.

The second gating signal SGT11a is outputted from the output terminal of the AND circuit 135.

The second gating signal SGT11a is delayed by T0/2 by the delay circuit 133, and the delayed signal is outputted as the second gating signal SGT11 to the voltage-controlled oscillator 140B.

FIGS. 21A to 21F illustrate an example of operation of the clock regeneration apparatus according to the present fourth embodiment.

Figure 21:
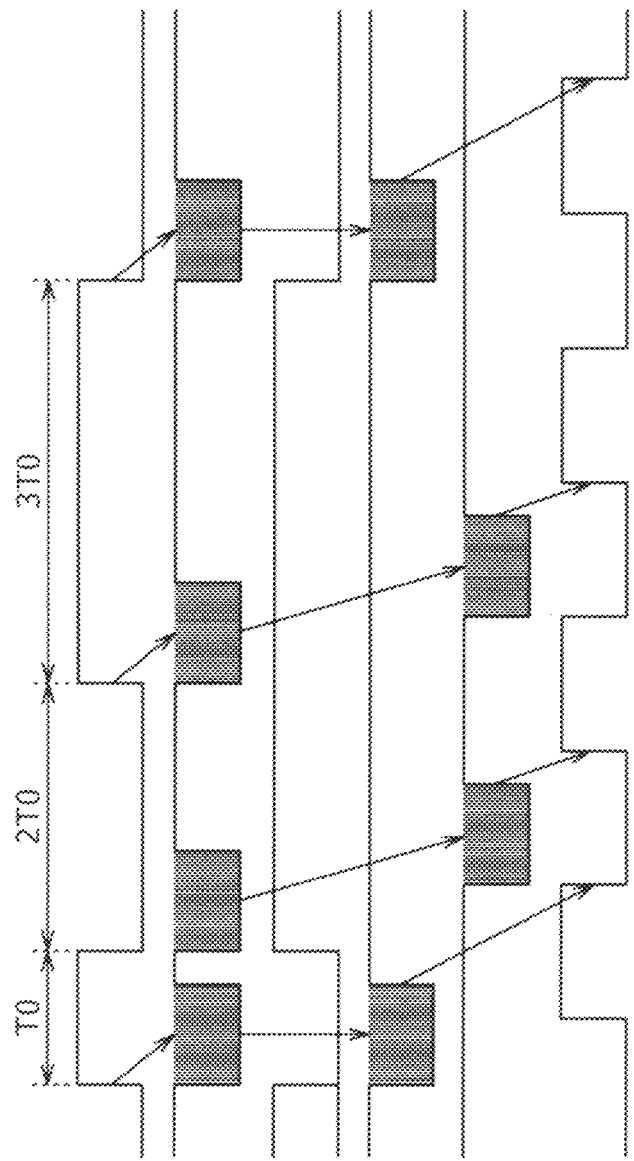
FIGS. 21A to 21F are timing charts illustrating an example of operation of the clock regeneration apparatus of FIG. 17.

In particular, FIG. 21A illustrates the reception data signal ROT; FIG. 21B the edge detection signal SEDA; and FIG. 21C the phase decision signal SPDA. Further, FIG. 21D illustrates the first gating signal SGT10; FIG. 21E the second gating signal SGT11; and FIG. 21F the clock signal CLK.

Operation of the clock regeneration apparatus 100C of the fourth embodiment is basically similar to that of the clock regeneration apparatus 100B of the third embodiment described hereinabove, and therefore, overlapping description of the operation is omitted herein to avoid redundancy.

5. Fifth Embodiment

Figure 22:
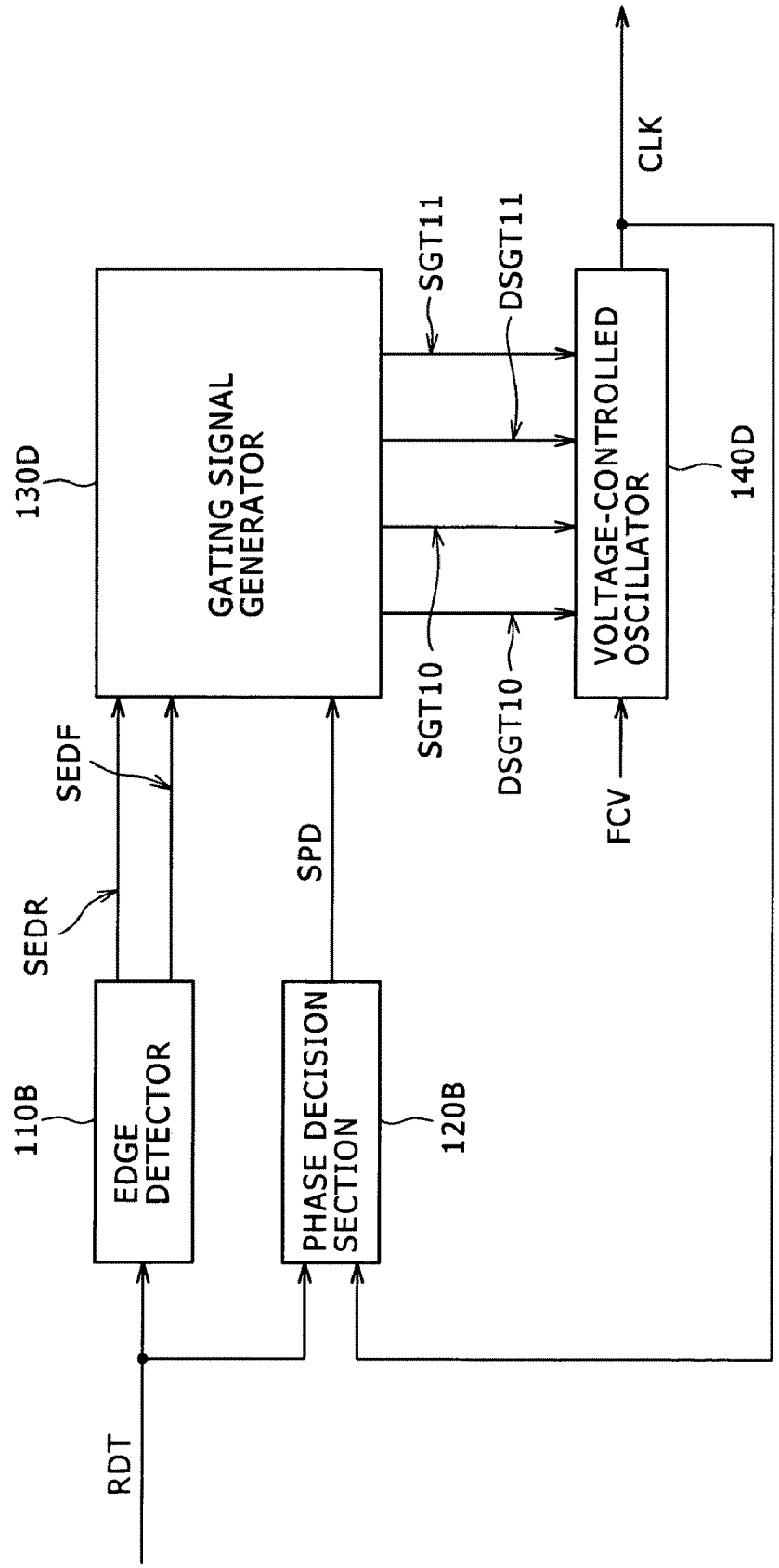
FIG. 22 is a block diagram showing an example of a configuration of a clock regeneration apparatus according to a fifth embodiment of the present invention.

FIG. 22 shows an example of a configuration of a clock regeneration apparatus according to a fifth embodiment of the present invention.

Referring to FIG. 22, the clock regeneration apparatus 100D according to the present fifth embodiment is similar to the clock regeneration apparatus 100B according to the third embodiment described hereinabove except the following points.

In particular, in the clock regeneration apparatus 100D, a gating signal generator 130D includes two first gating signals SGT10 and DSGT10 and two second gating signals SGT11 and DSGT11.

The gating signal generator 130D supplies two first gating signals DSGT10 and SGT10 separately to AND gates 141B and 142B of a first gating group GRP1B of a voltage-controlled oscillator 140D, respectively.

Similarly, the gating signal generator 130D supplies two second gating signals DSGT11 and SGT11 to AND gates 143B and 144B of a second gating group GRP2B of the voltage-controlled oscillator 140D, respectively.

Corresponding to this configuration, the clock regeneration apparatus 100D of the present fifth embodiment is different in the configuration of the gating signal generator 130D and the voltage-controlled oscillator 140D from that of the clock regeneration apparatus 100B.

Figure 23:
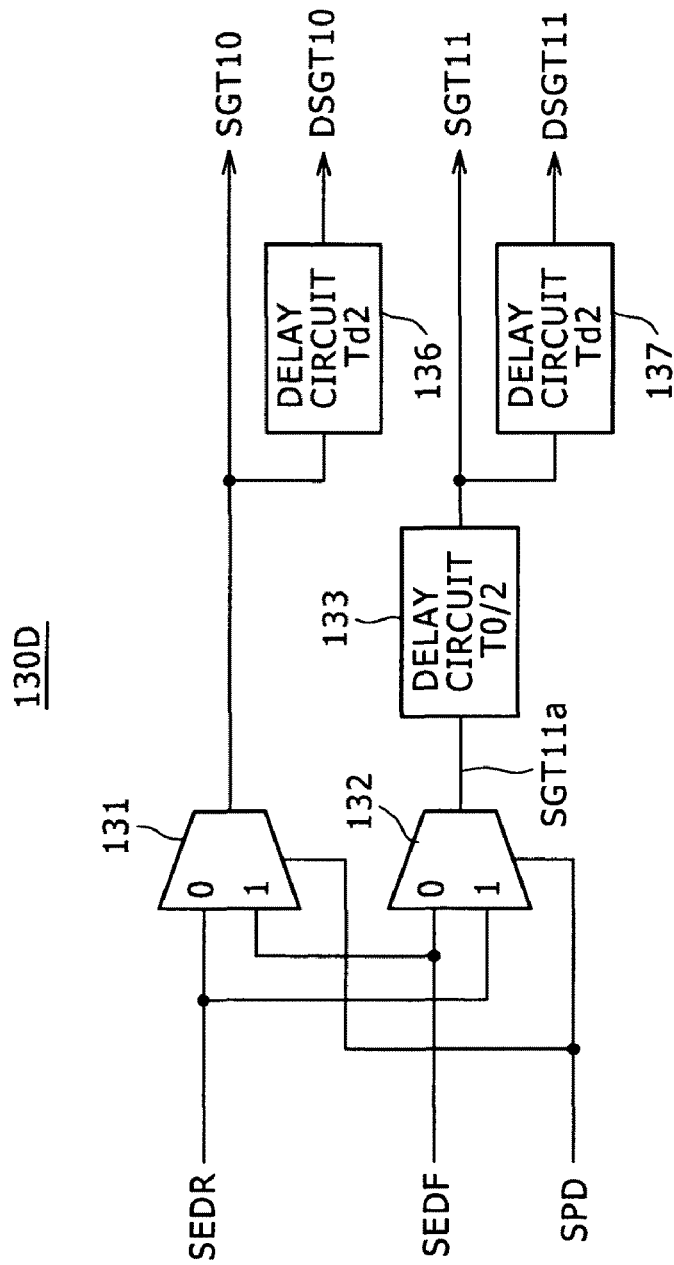
FIG. 23 is a circuit diagram showing an example of a configuration of a gating signal generator shown in FIG. 22.

FIG. 23 shows an example of a configuration of the gating signal generator 130D according to the fifth embodiment.

Referring to FIG. 23, the gating signal generator 130D includes a pair of selectors 131 and 132, a delay circuit 133 and a pair of delay circuits 136 and 137.

The selector 131 is connected at the input terminal "0" thereof to a supply line of the rising edge detection signal SEDR and at the input terminal "1" thereof to a supply line of the falling edge detection signal SEDF.

The selector 132 is connected at the input terminal "0" thereof to the supply line of the falling edge detection signal SEDF and at the input terminal "1" thereof to the supply line of the rising edge detection signal SEDR.

The selectors 131 and 132 select the input terminal "0" side when an inverted signal of the value of the clock signal is selected by the selector 123 of the phase decision section 120B and the phase decision signal SPD has the low level.

In particular, when the phase decision signal SPD has the low level, the selector 131 outputs the rising edge detection signal SEDR as the first gating signal SGT10.

Further, when the phase decision signal SPD has the low level, the selector 132 outputs the falling edge detection signal SEDF as the second gating signal SGT11a.

On the other hand, where the value of the clock signal CLK is selected by the selector 123 of the phase decision section 120B and the phase decision signal SPD has the high level, the selectors 131 and 132 select the input terminal "1" side.

In particular, when the phase decision signal SPD has the high level, the selector 131 outputs the falling edge detection signal SEDF as the first gating signal SGT10.

Further, when the phase decision signal SPD has the high level, the selector 132 outputs the rising edge detection signal SEDR as the second gating signal SGT11a.

The delay circuit 133 delays the second gating signal SGT11a outputted from the selector 132 by T0/2 and outputs the delayed second gating signal SGT11a as the second gating signal SGT11.

The configuration described above is same that described hereinabove with reference to FIG. 14.

The delay circuit 136 delays the first gating signal SGT10 outputted from the selector 131 by Td2 and outputs a resulting first delayed gating signal DSGT10.

The delay circuit 137 delays the second gating signal SGT11 outputted from the delay circuit 133 and outputs a resulting second delayed gating signal DSGT11.

It is assumed here that the delay time Td2 of the delay circuits 136 and 137 is shorter than ¼ the period T0 of the reception data signal RDT, that is, Td2<T0/4 is satisfied.

Figure 24:
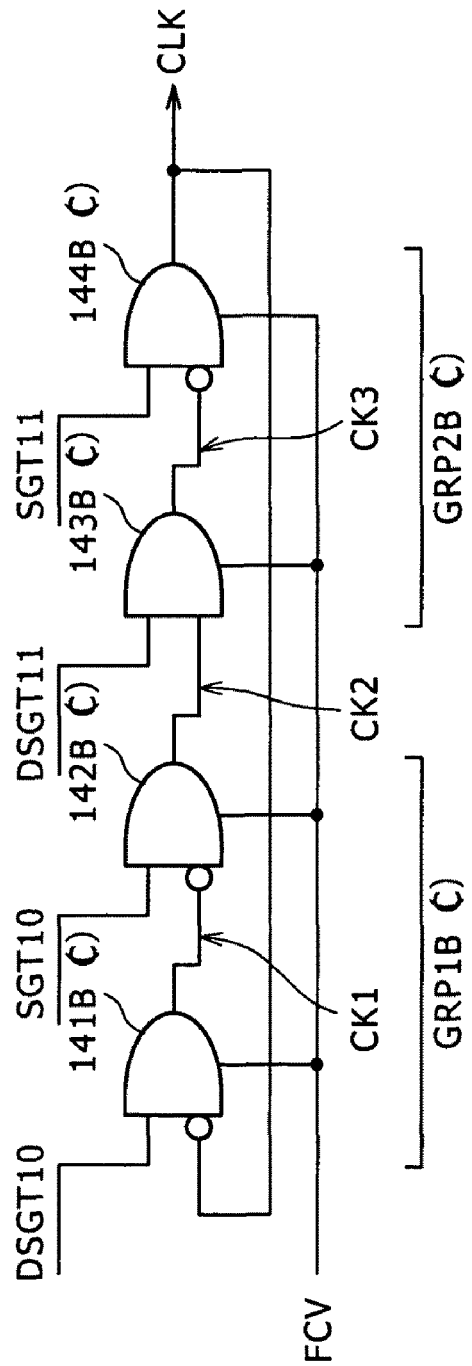
FIG. 24 is a circuit diagram showing an example of a configuration of a voltage-controlled oscillator shown in FIG. 22.

FIG. 24 shows an example of a configuration of the voltage-controlled oscillator according to the present fifth embodiment.

Referring to FIG. 24, the voltage-controlled oscillator 140D shown includes two-input AND gates 141B to 144B.

One of two input terminals, that is, a first input terminal, of the three AND gates 141B, 142B and 144B from among the four AND gates 141B to 144B is a negated input terminal.

The AND gate 141B is connected at the first input terminal thereof which is a negated input terminal to an output line of the clock signal CLK of the AND gate 144B and at the second input terminal thereof which is a non-negated input terminal to a supply line of the first delayed gating signal DSGT10.

The AND gate 142B is connected at the first input terminal thereof which is a negated input terminal to the output terminal of the AND gate 141B and at the second input terminal thereof which is a non-negated input terminal to a supply line of the first gating signal SGT10.

The AND gate 143B is connected at the first input terminal thereof which is a non-negated input terminal to the output terminal of the AND gate 142B and at the second input terminal thereof which is a non-negated input terminal to a supply line of the second delayed gating signal DSGT11.

The AND gate 144B is connected at the first input terminal thereof which is a negated input terminal to the output terminal of the AND gate 143B and at the second input terminal thereof which is a non-negated input terminal to a supply line of the second gating signal SGT11.

An oscillation frequency controlling signal FCV for controlling the frequency is supplied to the AND gates 141B to 144B.

The voltage-controlled oscillator 140D is configured such that it is possible to regenerate the clock signal CLK of a half rate synchronized with the reception data signal RDT.

Corresponding to this, the four AND gates 141B to 144B are grouped into the first gating group GRP1B of the two AND gates 141B and 142B at a preceding stage and the second gating group GRP2B of the two AND gates 143B and 144B at a succeeding stage.

To the first gating group GRP1B, the first gating signal SGT10 and the first delayed gating signal DSGT10 are supplied.

To the second gating group GRP2B, the second gating signal SGT11 and the second delayed gating signal DSGT11 are supplied.

The AND gate 141B outputs the first internal clock signal CK1 to the first input terminal which is a negated input terminal of the AND gate 142B at the succeeding stage.

The AND gate 142B outputs the second internal clock signal CK2 to the first input terminal which is a non-negated input terminal of the AND gate 143B at the succeeding stage.

The AND gate 143B outputs the third internal clock signal CK3 to the first input terminal which is a negated input terminal of the AND gate 144B.

FIGS. 25A to 25G illustrate an example of operation of the clock regeneration apparatus of the present fifth embodiment.

Figure 25:
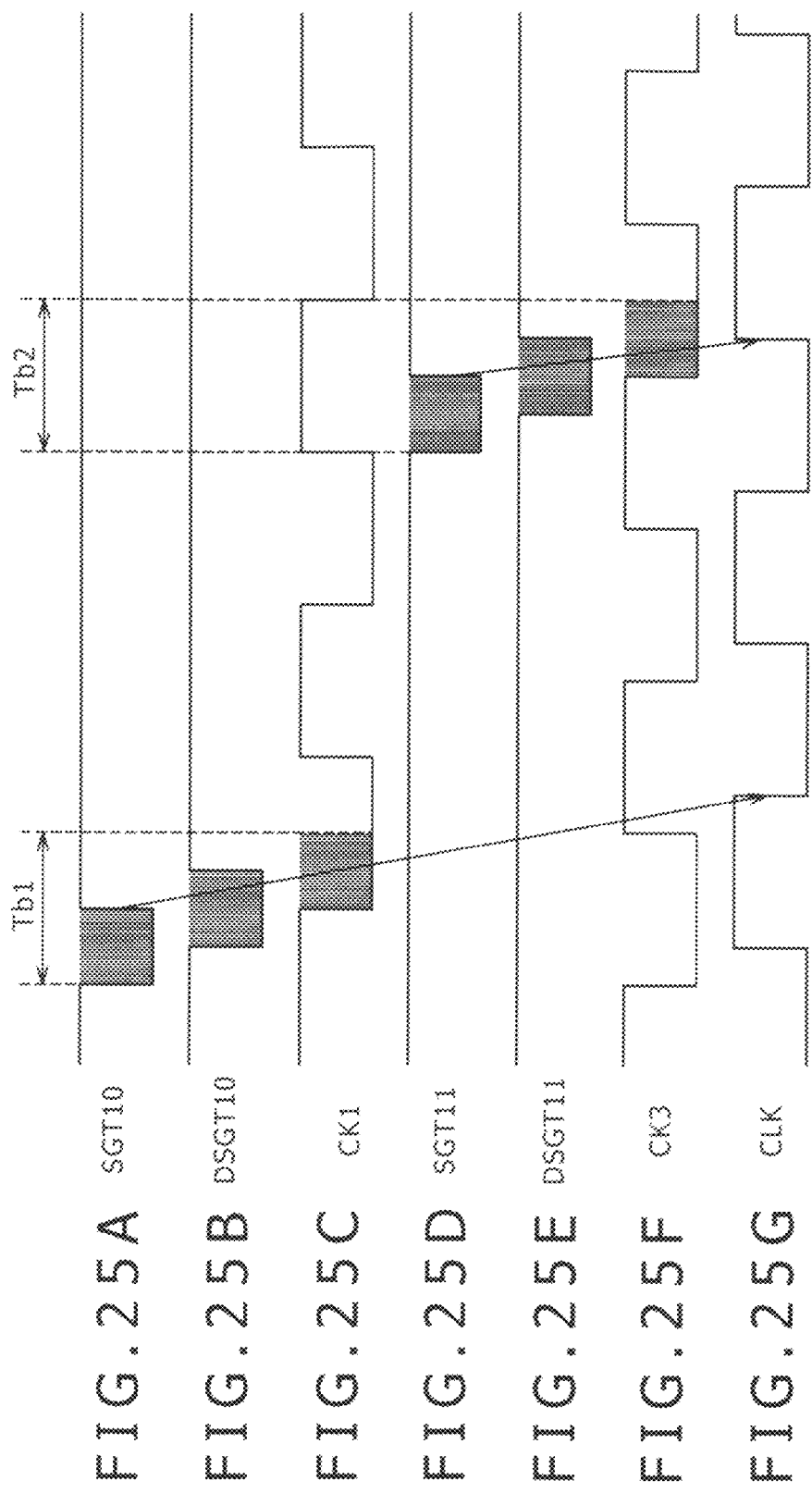
FIGS. 25A to 25G are timing charts illustrating an example of operation of the clock regeneration apparatus of FIG. 22.

In particular, FIG. 25A illustrates the first gating signal SGT10; FIG. 25B the first delayed gating signal DSGT10; and FIG. 25C the internal clock signal CK1. Further, FIG. 25D illustrates the second gating signal SGT11; FIG. 25E the second delayed gating signal DSGT11; FIG. 25F the internal clock signal CK3; and FIG. 25G the clock signal CLK.

Here, an example of operation of the clock regeneration apparatus 100D of the fifth embodiment is described with reference to FIGS. 25A to 25G.

In the present clock regeneration apparatus 100D, also the first and second delayed gating signals DSGT10 and DSGT11 obtained by delaying the first and second gating signals SGT10 and SGT11 by Td2 are used to synchronize the clock signal CLK with the reception data signal RDT.

While Td2<T0/4 is satisfied in the foregoing description, in FIGS. 25A to 25G, Td≈T0/2 and Td2≈T0/4 are satisfied.

If the first gating signal SGT10 is outputted as a pulse signal in response to an edge of the reception data signal RDT, then the oscillation loop of the voltage-controlled oscillator 140D is left in a disconnected state within a period within which the first gating signal SGT10 has the low level (L).

Further, the first delayed gating signal DSGT10 is outputted as a pulse signal. Consequently, also the first internal clock signal CK1 has the low level, and also within this period, the oscillation loop of the voltage-controlled oscillator 140D remains in a disconnected state by the first delayed gating signal DSGT10.

Here, in order to synchronize a falling edge of the clock signal CLK with a rising edge of the first gating signal SGT10, the input to the AND gate 142B is such as described below.

In particular, substantially not only within a period within which the first gating signal SGT10 has the low level but also within a period Tb1 illustrated in FIGS. 25A to 25C, the oscillation loop remains in a disconnected state.

Even if the timing of the first gating signal SGT10 or the first delayed gating signal DSGT10 is fluctuated with respect to the phase of the voltage-controlled oscillator 140D by jitters of the reception data signal RDT, an edge can be injected stably from the first gating signal SGT10.

Also where an edge is injected from the second gating signal SGT11, it is possible to inject an edge stably within a period Tb2.

Consequently, the tolerance to jitters of the reception data signal RDT is improved.

6. Sixth Embodiment

Figure 26:
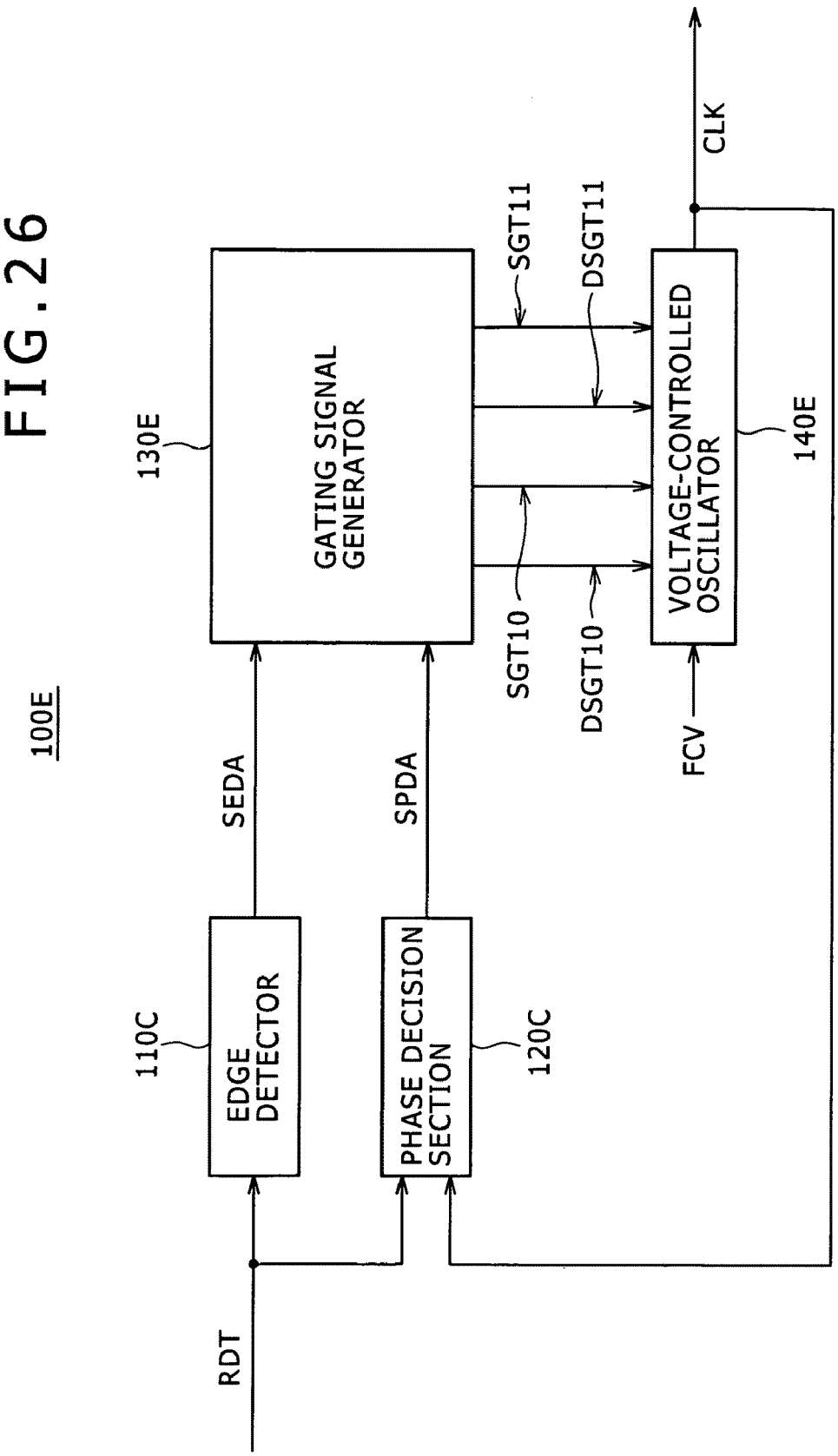
FIG. 26 is a block diagram showing an example of a configuration of a clock regeneration apparatus according to a sixth embodiment of the present invention.

FIG. 26 shows an example of a configuration of a clock regeneration apparatus according to a sixth embodiment of the present invention The clock regeneration apparatus 100E according to the present sixth embodiment is similar to the clock regeneration apparatus 100C according to the fourth embodiment described hereinabove except the following matters similarly to the relationship between the clock regeneration apparatus 100D according to the fifth embodiment and the clock regeneration apparatus 100B according to the third embodiment.

In particular, in the clock regeneration apparatus 100E, the gating signal generator 130E produces two first gating signals DSGT10 and SGT10 and two second gating signals DSGT11 and SGT11.

A gating signal generator 130E supplies two first gating signals DSGT10 and SGT10 to AND gates 141C and 142C of a first gating group GRP1C of a voltage-controlled oscillator 140E.

Similarly, the gating signal generator 130E supplies two second gating signals DSGT11 and SGT11 to AND gates 143C and 144C of a second gating group GRP2C of thea voltage-controlled oscillator 140E.

Corresponding to the configuration, the clock regeneration apparatus 100E of the sixth embodiment is different in the configuration of the gating signal generator 130E and the voltage-controlled oscillator 140E from the clock regeneration apparatus 100C of the fourth embodiment.

Figure 27:
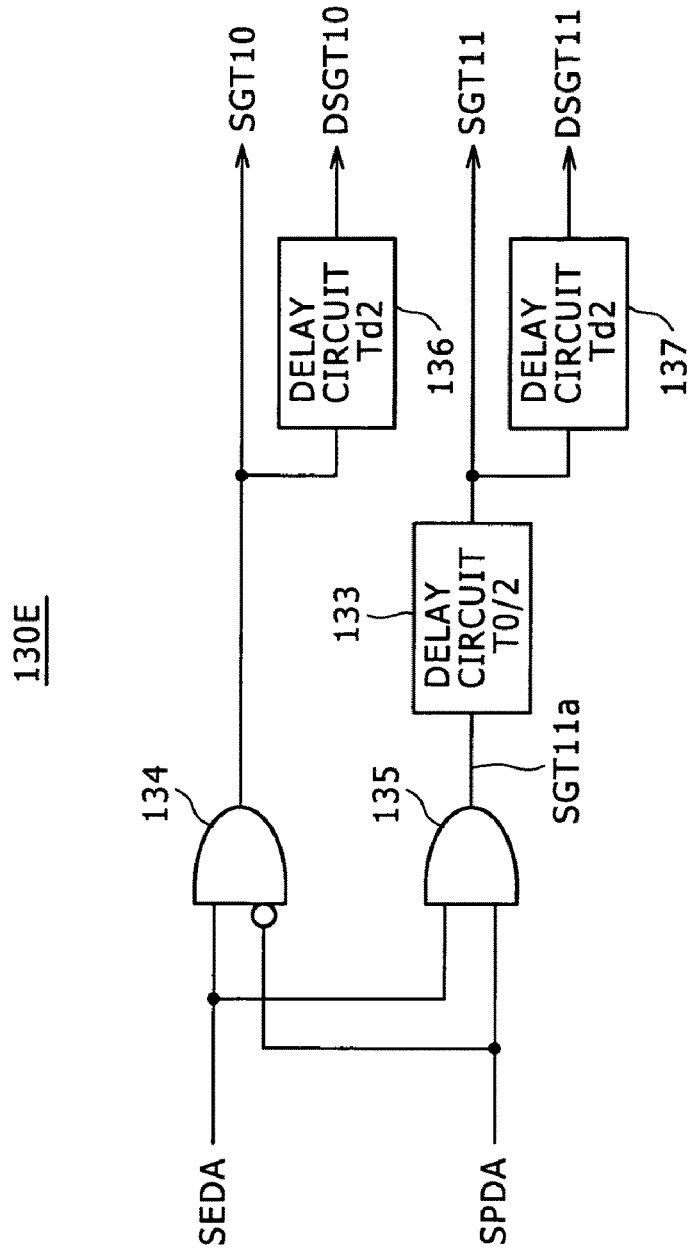
FIG. 27 is a circuit diagram showing an example of a configuration of a gating signal generator shown in FIG. 26.

FIG. 27 shows an example of a configuration of the gating signal generator in the sixth embodiment.

Referring to FIG. 27, the gating signal generator 130E includes a delay circuit 133, a pair of two-input AND circuits 134 and 135 and a pair of delay circuits 136 and 137.

The AND circuit 134 is connected at the first input terminal thereof to a supply line of the edge detection signal SEDA and at the second input terminal thereof which is a negated input terminal to a supply line of the phase decision signal SPDA.

The first gating signal SGT10 is outputted from the output terminal of the AND circuit 134.

The AND circuit 135 is connected at the first input terminal thereof to a supply line of the edge detection signal SEDA and at the second input terminal thereof to the supply line of the phase decision signal SPDA.

A second gating signal SGT11a is outputted from the output terminal of the AND circuit 135.

The second gating signal SGT11a is delayed by T0/2 by the delay circuit 133, and the delayed signal is outputted as the second gating signal SGT11.

The delay circuit 136 delays the first gating signal SGT10, which is an output of the AND gate 134, by Td2 and outputs a resulting first delayed gating signal DSGT10.

The delay circuit 137 delays the second gating signal SGT11, which is an output of the delay circuit 133, by Td2 and outputs a resulting second delayed gating signal DSGT11.

It is assumed here that the delay time Td2 of the delay circuits 136 and 137 is shorter than 1/4 the period T0 of the reception data signal RDT, that is, Td2<T0/4 is satisfied.

The voltage-controlled oscillator 140E in the present sixth embodiment is similar to that in the fifth embodiment described hereinabove with reference to FIG. 24, and therefore, overlapping description of the same is omitted herein to avoid redundancy.

Further, operation of the clock regeneration apparatus 100E of the sixth embodiment is basically similar to that of the clock regeneration apparatus 100D of the fifth embodiment described hereinabove with reference to FIGS. 25A to 25G, and therefore, overlapping description of the operation is omitted herein to avoid redundancy.

With the present sixth embodiment, the tolerance to jitters of the reception data signal RDT is improved similarly to the fifth embodiment described hereinabove. Example of a Configuration of the Delay Circuit Here, an example of a configuration of the delay circuit included in the clock regeneration apparatus of the first to sixth embodiments is described.

Figure 28:
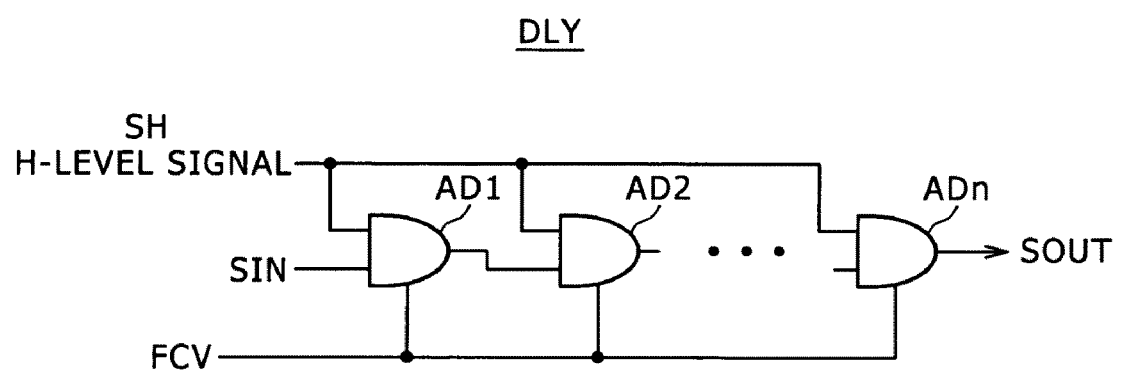
FIG. 28 is a circuit diagram showing an example of a configuration of a delay circuit included in the clock regeneration apparatus of the first to sixth embodiments.

FIG. 28 shows an example of a configuration of the delay circuit in any of the clock regeneration apparatus of the first to sixth embodiments.

Referring to FIG. 28, the delay circuit DLY shown includes one or a plurality of AND gates AD1 to ADn.

The AND gates AD1 to ADn have a configuration similar to that of the AND gate 141 which configures the voltage-controlled oscillator 140 and so forth.

The propagation delay time of the AND gates AD1 to ADn is controlled substantially by an oscillation frequency controlling signal FCV.

Consequently, the delay time from an input signal SIN to an output signal SOUT is controlled based on the oscillation frequency controlling signal FCV.

First Example of a Connection Scheme of the Clock Regeneration Apparatus

Figure 29:
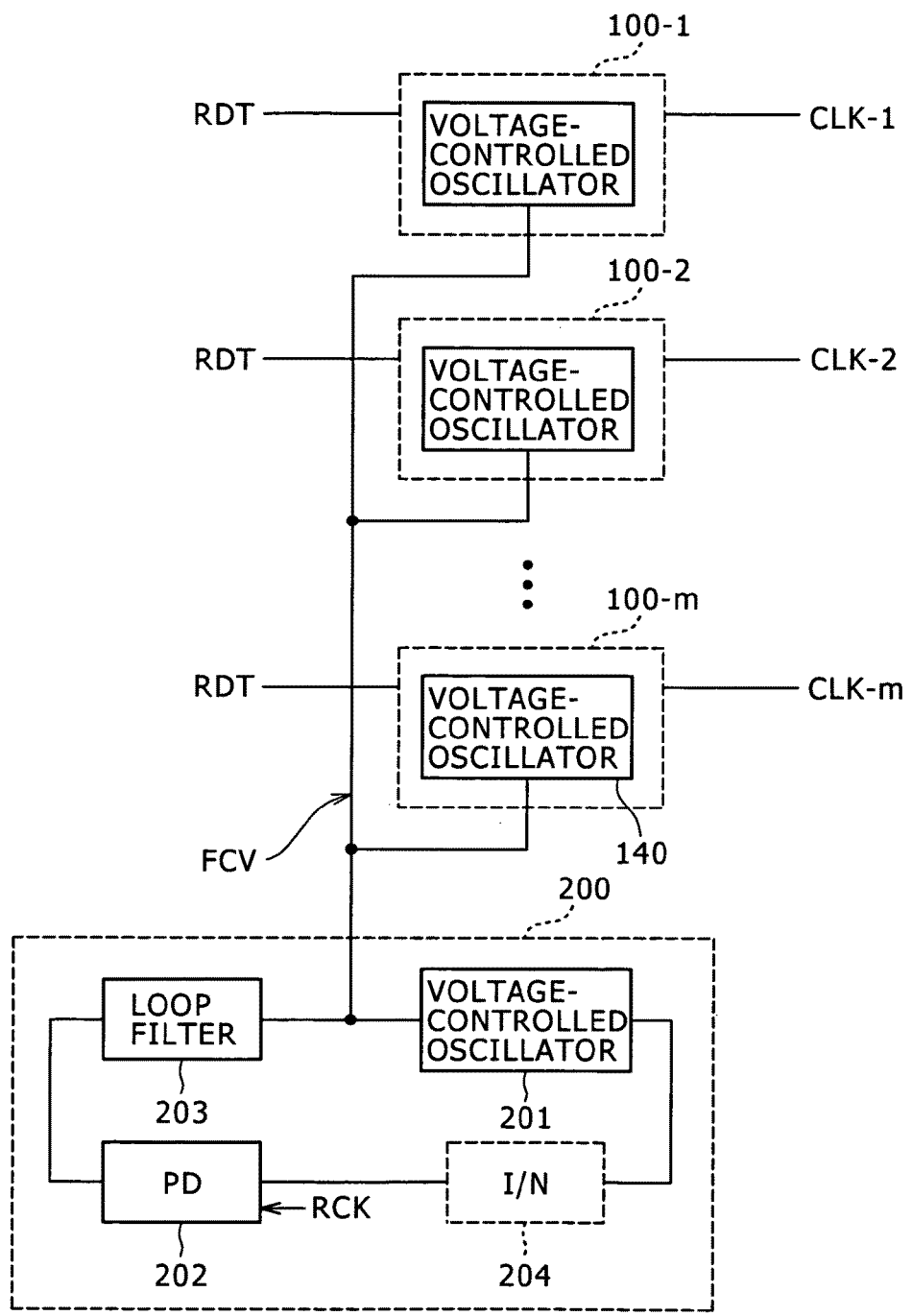
FIGS. 29 and 30 are block diagrams showing first and second examples of a connection scheme of the clock regeneration apparatus according to the embodiments of the present invention.

FIG. 29 shows a first example of a connection scheme of a clock regeneration apparatus according to any one of the first to sixth embodiments described hereinabove.

Referring to FIG. 29, the connection scheme shown includes a plurality of clock regeneration apparatus 100-1 to 100-m disposed in parallel, and an oscillation frequency controlling signal FCV produced by a phase synchronizing circuit 200 in the form of a PLL is supplied to the clock regeneration apparatus 100-1 to 100-m.

Any of the clock regeneration apparatus described hereinabove in connection with the first to fourth embodiments is applied to the clock regeneration apparatus 100-1 to 100-m in FIG. 29.

In FIG. 29, only a voltage-controlled oscillator 140 to which the oscillation frequency controlling signal FCV is applied is shown in the blocks of the clock regeneration apparatus 100-1 to 100-m for simplified illustration.

The PLL 200 includes a voltage-controlled oscillator 201, a phase comparator 202 and a loop filter 203. A frequency divider 204 may be disposed on the output side of the voltage-controlled oscillator 201.

An output of the loop filter 203 of the PLL 200 is outputted as the oscillation frequency controlling signal FCV.

The voltage-controlled oscillator 201 of the PLL 200 may have a configuration same as that of the voltage-controlled oscillator 140 in the clock regeneration apparatus 100-1 to 100-m.

This makes it possible to control the oscillation frequency with a high degree of accuracy.

Clocks CLK-1 to CLK-m are outputted from the clock regeneration apparatus 100-1 to 100-m, respectively, in synchronism with the reception data signal RDT.

Second Example of a Connection Scheme of the Clock Regeneration Apparatus

Figure 30:
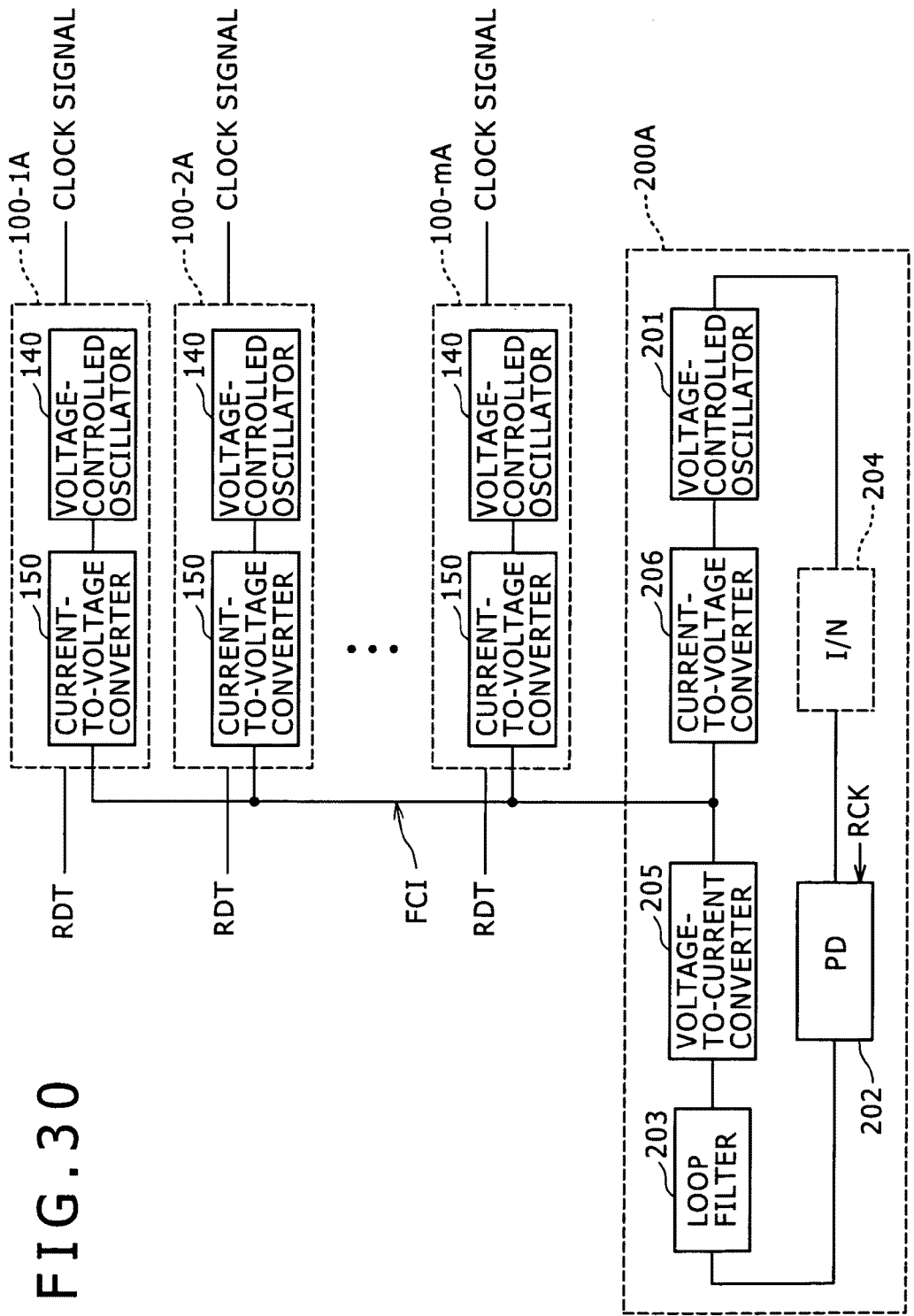

FIG. 30 shows a second example of a connection scheme of the clock regeneration apparatus according to any one of the first to sixth embodiments described hereinabove.

The second example of a connection scheme is different from the first example of a connection scheme described hereinabove in that oscillation frequency controlling current FCI is supplied from a PLL 200A in place of supplying the oscillation frequency controlling signal FCV.

Corresponding to this, a voltage-to-current converter (VI converter) 205 is disposed on the output side of the loop filter 203 of the PLL 200A, and an output of the voltage-to-current converter 205 is supplied as the oscillation frequency controlling current FCI.

In the PLL 200A, a current-to-voltage converter. (IV converter) 206 is disposed on the input side of the voltage-controlled oscillator 201.

Further, a current-to-voltage converter (IV converter) 150 is disposed also on the input side of the voltage-controlled oscillator 140 of the clock regeneration apparatus 100-1A to 100-mA.

In this instance, since not a control voltage but control current is supplied, the control current can be supplied precisely as a control signal without being influenced by a voltage variation or the like. Consequently, oscillation control of a higher degree of accuracy can be anticipated.

7. Seventh Embodiment

Figure 31:
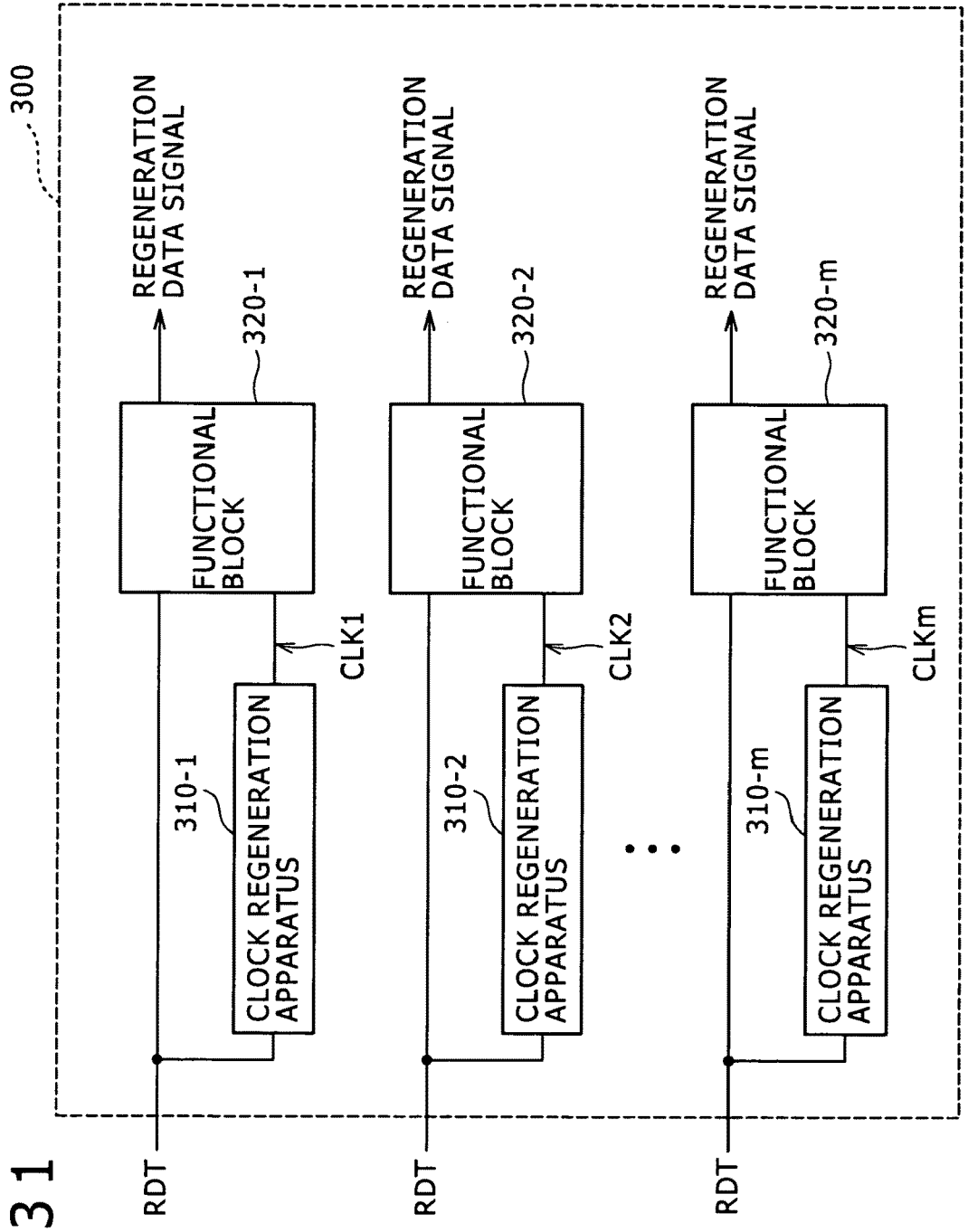
FIG. 31 is a block diagram showing an example of a configuration of an electronic equipment according to a seventh embodiment of the present invention.

FIG. 31 shows an example of a configuration of an electronic equipment according to a seventh embodiment of the present invention.

Referring to FIG. 31, the electronic equipment 300 includes a plurality of clock regeneration apparatus 310-1 to 310-m and a plurality of functional blocks 320-1 to 320-m.

The clock regeneration apparatus 310-1 to 310-m are configured by applying any of the clock regeneration apparatus described hereinabove in connection with the first to fourth embodiments.

The functional blocks 320-1 to 320-m carry out a regeneration process and so forth for a reception data signal RDT in synchronism with clock signals CLK1 to CLKm regenerated by the clock regeneration apparatus 310-1 to 310-m, respectively.

The electronic equipment 300 may be, for example, a personal computer, a television receiver or the like which has a function of fetching a digital image signal to reproduce reproduction data RPD.

Or, it is possible to configure the electronic equipment 300 as a semiconductor integrated circuit wherein the clock regeneration apparatus 310-1 to 310-m and the functional blocks 320-1 to 320-m are integrated in the same chip.

In the clock regeneration apparatus of the embodiments described hereinabove, a clock signal of a half rate is regenerated. However, the present invention is not limited to regeneration to a half rate, but further expansion, that is, regeneration to a sub rate, can be anticipated. Further, while a configuration for a single signal is described, a configuration for differential signals may be used instead.

Now, a clock regeneration apparatus which regenerates a clock signal of a ¼ rate is described as an example of the seventh embodiment of the present invention.

8. Eighth Embodiment

Figure 32:
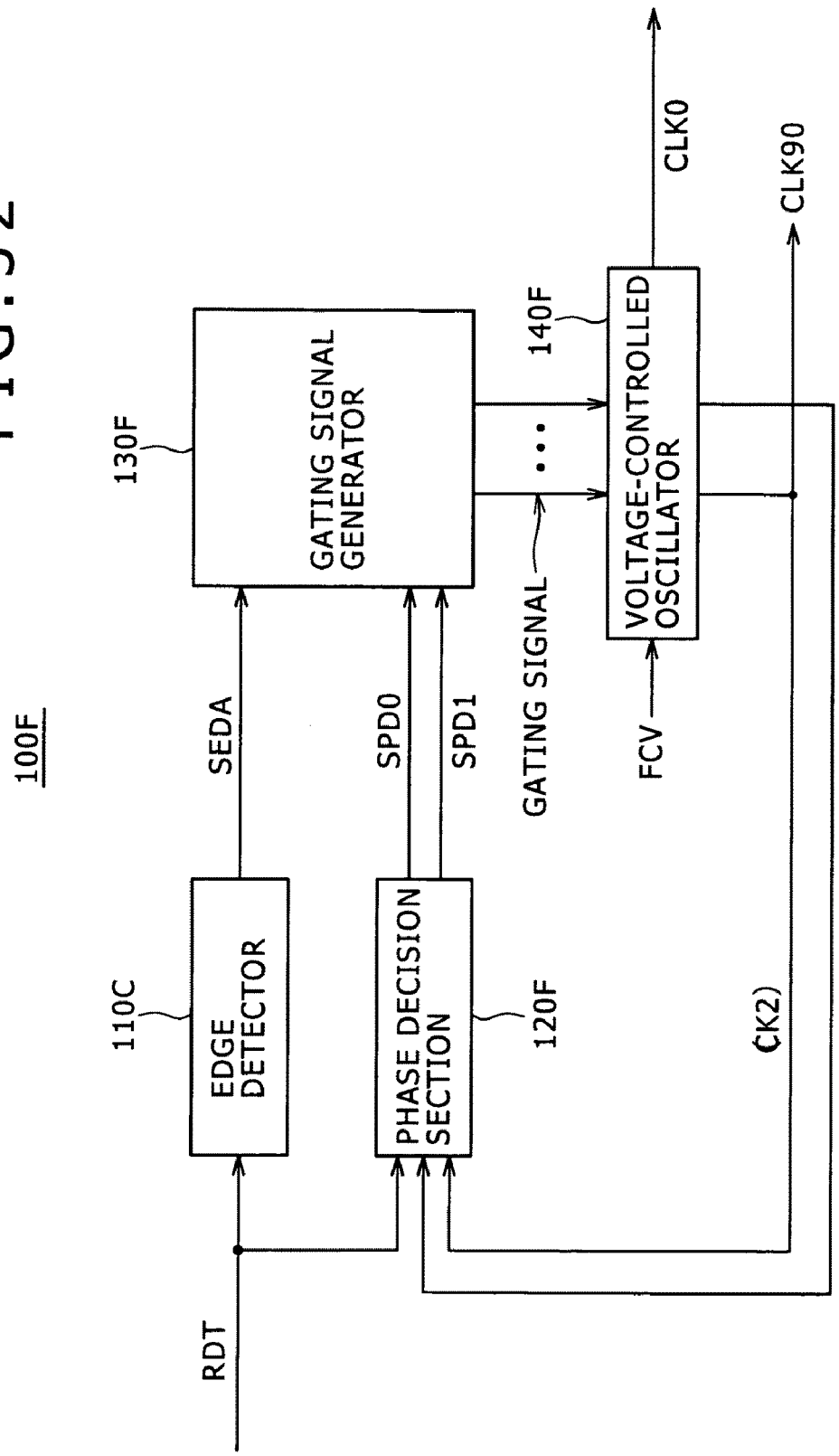
FIG. 32 is a block diagram showing an example of a configuration of a clock regeneration apparatus according to an eighth embodiment of the present invention.
Figure 33:
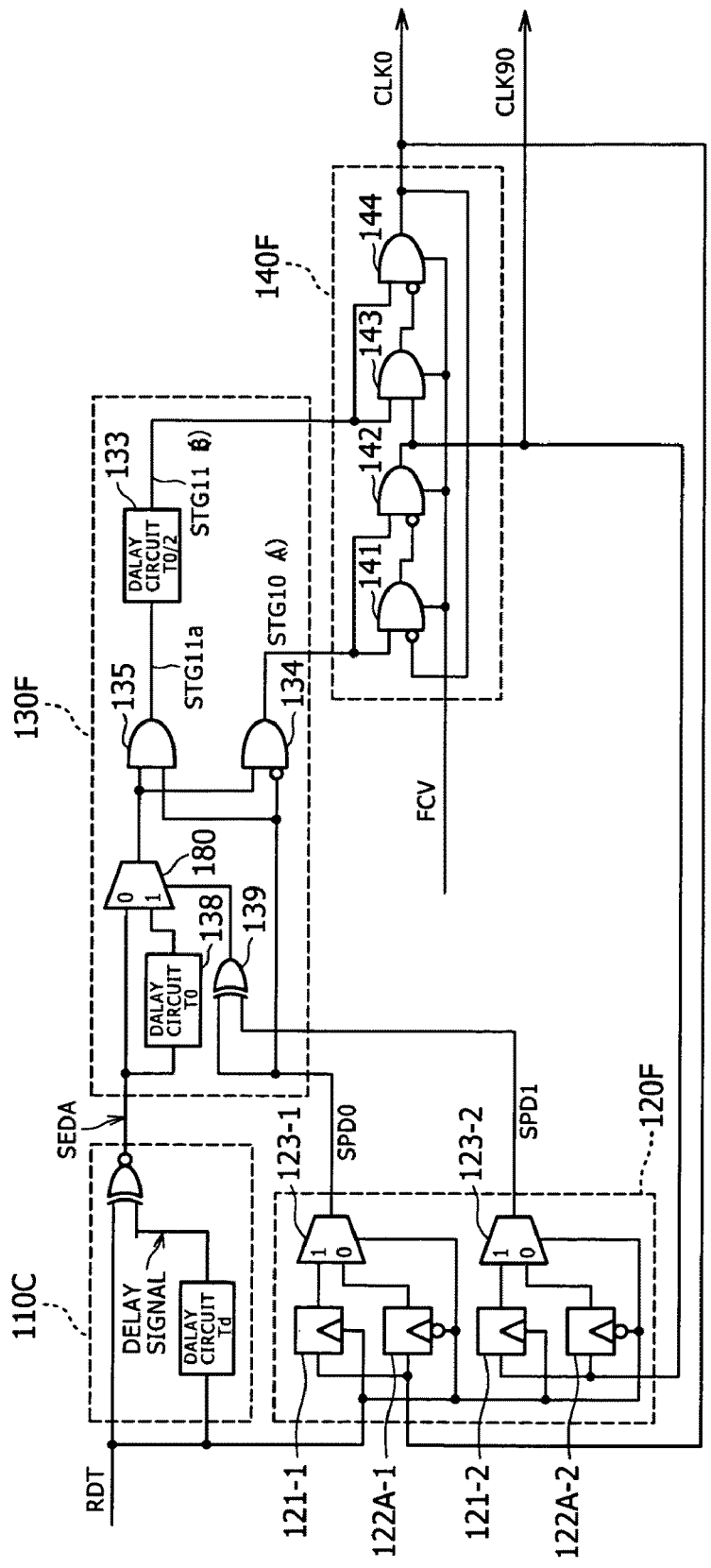
FIG. 33 is a circuit diagram shown an example of a more detailed configuration of the clock regeneration apparatus of FIG. 32.

FIG. 32 is a block diagram showing an example of a configuration of a clock regeneration apparatus according to an eighth embodiment of the present invention, and FIG. 33 is a circuit diagram showing an example of a more detailed configuration of the clock regeneration apparatus of FIG. 32.

Referring to FIGS. 32 and 33, the clock regeneration apparatus 100F according to the eighth embodiment is similar to the clock regeneration apparatus 100C according to the fourth embodiment except the configuration of an edge detector 110C, a phase decision section 120F and a gating signal generator 130F.

In the eighth embodiment, a voltage-controlled oscillator 140F has a basic configuration similar to that shown in FIG. 15.

However, in the present eighth embodiment, the voltage-controlled oscillator 140F has a function of outputting an internal clock signal CK2, which is an output of a first gating group GRP1 of the voltage-controlled oscillator 140F, as a clock signal CLK90 having a phase displaced by 90 degrees from that of an output clock signal CLK0 together with the output clock signal CLK0.

The internal clock signal CLK90 is supplied to the phase decision section 120F together with the output clock signal CLK0.

The phase decision section 120F according to the present eighth embodiment has a circuit configuration which can reduce the circuit area and the power consumption similarly to the phase decision section 120C described hereinabove with reference to FIG. 18. Accordingly, overlapping description of the circuit configuration is omitted herein to avoid redundancy.

The phase decision section 120F according to the present eighth embodiment includes, in addition to a phase decision section for the clock signal CLK0 having a configuration similar to that of the phase decision section 120C of FIG. 19, a phase decision section for the clock signal CLK90 disposed in parallel to the phase decision section.

The phase decision section 120F in FIG. 33 includes a pair of flip-flops 121-1 and 122A-1 and a selector 123-1, which form the phase decision section for the clock signal CLK0.

The phase decision section 120F further includes a pair of flip-flops 121-2 and 122A-2 and a selector 123-2, which form the phase decision section for the clock signal CLK90.

The flip-flop 121-1 carries out fetching and outputting of a clock signal CLK0 outputted from the voltage-controlled oscillator 140F in synchronism with an edge of the reception data signal RDT.

The flip-flop 122A-1 carries out fetching and outputting of the clock signal CLK0 outputted from the voltage-controlled oscillator 140F in synchronism with an inverted signal of an edge of the reception data signal RDT.

The selector 123-1 selects, within a period within which the reception data signal RDT has the high level, an output signal of the flip-flop 121-1 and outputs the selected signal as the phase decision signal SPD0.

On the other hand, the selector 123-1 selects, within a period within which the reception data signal RDT has the low level, an output signal of the flip-flop 122A-1 and outputs the selected signal as the phase decision signal SPD0.

The flip-flop 121-2 carries out fetching and outputting of the clock signal CLK90 outputted from the voltage-controlled oscillator 140F in synchronism with the edge of the reception data signal RDT.

The flip-flop 122A-2 carries out fetching and outputting of the clock signal CLK90 outputted from the voltage-controlled oscillator 140F in synchronism with an inverted signal of an edge of the reception data signal RDT.

The selector 123-2 selects, within a period within which the reception data signal RDT has the high level, an output signal of the flip-flop 121-2 and outputs the selected signal as a phase decision signal SPD1.

On the other hand, the selector 123-2 selects, within a period within which the reception data signal RDT has the low level, an output signal of the flip-flop 122A-2 and outputs the selected signal as the phase decision signal SPD1.

The gating signal generator 130F in the present eighth embodiment includes, in addition to the configuration of the gating signal generator 130C shown in FIG. 20, a delay circuit 138, an EXOR gate 139 and a selector 180 provided on the input side of the AND circuits 134 and 135.

The delay circuit 138 delays the edge detection signal SEDA by T0.

The EXOR gate 139 exclusively ORs the two phase decision signals SPD0 and SPD1 from a phase decision section 120F, and a result of the exclusive ORing is used as a select signal for the selector 180.

The selector 180 is connected at the input terminal "0" thereof to a supply line of the edge detection signal SEDA and at the input terminal "1" thereof to an output terminal of the delay circuit 138.

The selector 180 selects and outputs the edge detection signal SEDA or the delayed signal of the same in response to the output of the EXOR gate 139.

The AND circuit 134 is connected at the first input terminal thereof to the output terminal of the selector 180 and at the second input terminal thereof which is a negated input terminal to a supply line of the phase decision signal SPD0.

A first gating signal SGT10(A) is outputted from the output terminal of the AND circuit 134.

The AND circuit 135 is connected at the first input terminal thereof to the output line of the selector 180 and at the second input terminal thereof to the supply line of the phase decision signal SPD0.

A second gating signal SGT11*a* is outputted from the output terminal of the AND circuit 135.

The second gating signal SGT11*a* is delayed by T0/2 by the delay circuit 133, and the delayed signal is outputted as a second gating signal SGT11(B) to the voltage-controlled oscillator 140F.

FIGS. 34A to 34G illustrate an example of operation of the clock regeneration apparatus according to the present eighth embodiment.

Figure 34:
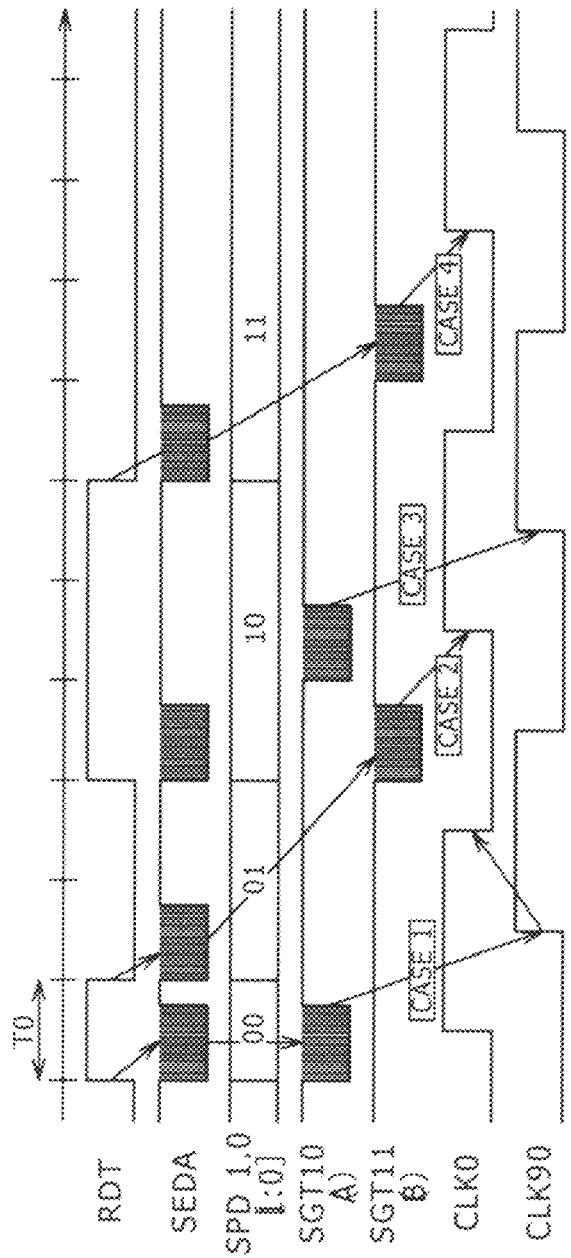
FIGS. 34A to 34G are timing charts illustrating an example of operation of the clock regeneration apparatus of FIG. 32.

In particular, FIG. 34A illustrates the reception data signal RDT; FIG. 34B the edge detection signal SEDA; FIG. 34C the values of 2 bits of the phase decision signals SPD1 and SPD0; and FIG. 34D the first gating signal SGT10(A). FIG. 34E illustrates the second gating signal SGT11(B); FIG. 34F the clock signal CLK0; and FIG. 34G the clock signal CLK90.

FIG. 35 illustrates a relationship of a clock signal, a phase decision signal, a gating signal, delay time and an edge input to a clock signal in the present eighth embodiment.

For example, where the clock signal CLK90 and the clock signal CLK0 have the low level (L), the phase decision signals SPD1 and SPD0 are "00" and the first gating signal SGT10(A) is rendered active.

In this instance, the delay time is 0, and the clock signal which is synchronized after 3T0 of an edge input is a falling edge of the clock signal CLK90.

Where the clock signal CLK90 has the low level (L) and the clock signal CLK0 has the high level (H), the phase decision signals SPD1 and SPD0 are "01" and the second gating signal SGT11(B) is rendered active.

In this instance, the delay time is 2T0, and the clock signal which is synchronized after 3T0 of the edge input is a rising edge of the output clock signal CLK0.

Where the clock signal CLK90 has the high level (H) and the clock signal CLK0 has the low level (L), the phase decision signals SPD1 and SPD0 are "10" and the first gating signal SGT10(A) is rendered active.

In this instance, the delay time is T0 and the clock signal which is synchronized after 3T0 of the edge input is a falling edge of the clock signal CLK0.

Where both of the clock signal CLK90 and the clock signal CLK0 have the high level (H), the phase decision signals SPD1 and SPD0 are "11" and the second gating signal SGT11(B) is rendered active.

In this instance, the delay time is T0, and the clock signal which is synchronized after 3T0 of the edge input is a rising edge of the clock signal CLK90.

The clock signals CLK0 and CLK90 synchronized with the reception data signal RDT and having a phase of 90 degrees are generated and outputted in this manner.

Figure 36:
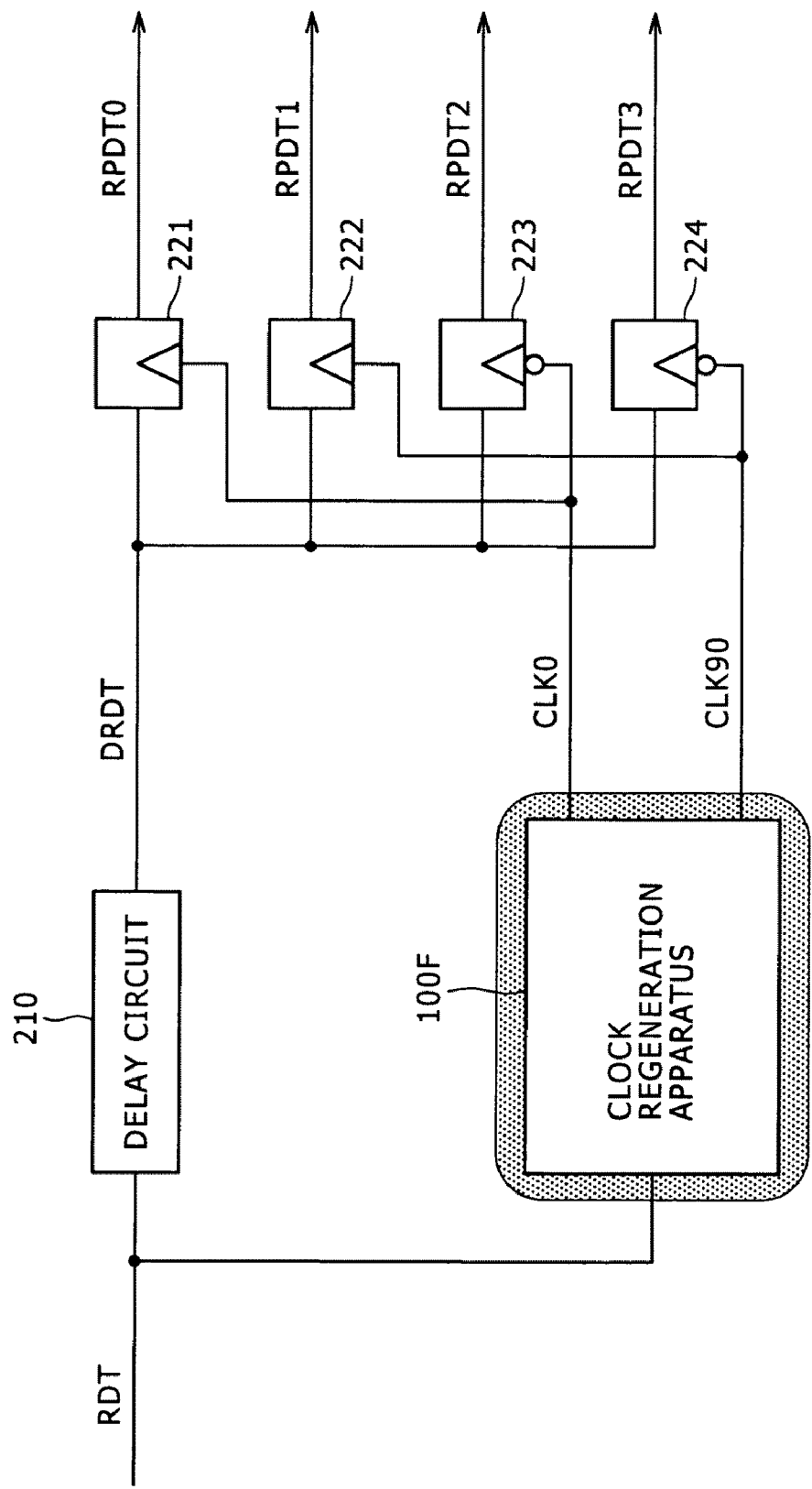
FIG. 36 is a block diagram showing an example of a connection scheme of the clock regeneration apparatus of FIG. 32.

Example of a Connection Scheme of the Clock Regeneration Apparatus of the Eighth Embodiment FIG. 36 illustrates an example of a connection scheme of the clock regeneration apparatus according to the eighth embodiment of the present invention.

FIG. 37A to 37E illustrate an example of operation of the circuit configuration of FIG. 36.

In particular, FIG. 37A illustrates the reception data delayed signal DRDT; FIG. 37B the clock signal CLK0; FIG. 37C the clock signal CLK90; FIG. 37D an inverted signal of the clock signal CLK0; and FIG. 37E an inverted signal of the clock signal CLK90.

Referring first to FIG. 36, in the connection scheme shown, a delay circuit 210 is disposed in parallel to the clock regeneration apparatus 100F.

The delay time of the delay circuit 210 is set to time corresponding to a period of time required for a clock regeneration process of the clock regeneration apparatus 100F.

Further, in the connection scheme, flip-flops 221 to 224 are disposed.

The flip-flop 221 fetches the reception data delayed signal DRDT received through the delay circuit 210 in synchronism with the clock signal CLK0 regenerated by the clock regeneration apparatus 100F and outputs a regeneration data signal RPDT0.

The flip-flop 222 fetches the reception data delayed signal DRDT received through the delay circuit 210 in synchronism with the clock signal CLK90 regenerated by the clock regeneration apparatus 100F and outputs a regeneration data signal RPDT1.

The flip-flop 223 fetches the reception data delayed signal DRDT received through the delay circuit 210 in synchronism with an inverted signal of the clock signal CLK0 regenerated by the clock regeneration apparatus 100F and outputs a regeneration data signal RPDT2.

The flip-flop 224 fetches the reception data delayed signal DRDT received through the delay circuit 210 in synchronism with an inverted signal of the clock signal CLK90 regenerated by the clock regeneration apparatus 100F and outputs a regeneration data signal RPDT3.

As described above, according to the present embodiment, the following advantages can be anticipated.

In the clock regeneration apparatus according to the present embodiment, a signal representative of edge detection of a reception data signal is delay-controlled and is injected into an oscillator from a selected one of a plurality of places of the oscillator. Then, a rising edge of a clock signal is synchronized with the signal injected to at least one place of the oscillator, and a falling edge is synchronized with the signal injected to another one of the places of the oscillator.

Consequently, a clock signal which has a sub rate with respect to a transfer rate and is synchronized with the reception data signal can be regenerated, and increase of the transfer rate and reduction of the power consumption can be implemented.

Further, it is possible to improve the tolerance to jitters included in the reception data signal by means of an edge detector which includes circuits for individually detecting a rising edge and a falling edge of the reception data signal.

The present application contains subject matter related to that disclosed in Japanese Priority Patent Application JP 2009-133238 filed in the Japan Patent Office on Jun. 2, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A clock regeneration apparatus, comprising:
an oscillator including n gating groups connected in cascade connection to each other in such a manner as to be capable of forming an oscillation loop, n being an integer of two or more, said gating groups being controlled to gate an internal clock signal with first to nth gating signals different from one another, respectively, said oscillator outputting a clock signal at least from the nth one of said gating groups;
an edge detection section adapted to detect an edge of a reception data signal;
a phase decision section adapted to decide a phase of the clock signal for each edge of the reception data signal and output a result of the decision as a phase decision signal; and
a gating signal generation section adapted to generate the first to nth gating signals and output the gating signals to first to nth ones of said gating groups of said oscillator, respectively;
said gating signal generation section being operable to select one of the gating signals into which an edge detection signal of said edge detection section is to be injected in response to the phase decision signal of said phase decision section, delaying the selected gating signal and outputting the gating signal to said oscillator;
said oscillator outputting the clock signal having a phase controlled based on the first to nth gating signals and synchronized with the reception data signal.

2. A clock regeneration apparatus, comprising:
an oscillator including first and second gating groups connected in cascade connection to each other in such a manner as to be capable of forming an oscillation loop, said first and second gating groups being controlled to gate an internal clock signal with first and second gating signals different from each other, respectively, said oscillator outputting a clock signal at least from said second gating group;
an edge detection section adapted to detect an edge of a reception data signal;
a phase decision section adapted to decide a phase of the clock signal for each edge of the reception data signal and output a result of the decision as a phase decision signal; and
a gating signal generation section adapted to generate the first and second gating signals and output the first and second gating signals to said first and second gating groups of said oscillator, respectively;
said gating signal generation section being operable to generate, as the first gating signal, one of a signal which indicates rising edge detection and another signal which indicates falling edge detection based on a result of the detection by said edge detection section in response to a phase decision signal of said phase decision section, and delay the other one of the signals by one half cycle that of the reception data signal to generate the second gating signal;
said oscillator outputting the clock signal having a phase controlled based on the first and second gating signals and synchronized with the reception data signal.

3. The clock regeneration apparatus according to claim 2, wherein one of said first gating group of said oscillator to which the first gating signal is supplied and said second gating group of said oscillator to which the second gating signal is supplied is synchronized with the rising edge and the other one of said first and second gating groups is synchronized with the falling edge.

4. The clock regeneration apparatus according to claim 2, wherein said first and second gating groups of said oscillator individually include two stages of two-input gates;
the first gating signal being inputted to one of the input terminals of each of said gates of said first gating group;
the second gating signal being inputted to one of the input terminals of each of said gates of said second gating group;
said gates of said first and second gating groups being connected in cascade connection to each other while said oscillation loop is formed through the other ones of the input terminals of said gates.

5. The clock regeneration apparatus according to claim 2, wherein said first and second gating groups of said oscillator individually include two stages of two-input gates;

said gating signal generation section delaying the first gating signal by ¼ or less a period of the reception data signal to generate a first delayed gating signal;

said gating signal generation section delaying the second gating signal by ¼ or less a period of the reception data signal to generate a second delayed gating signal;

the first delayed gating signal being inputted to one of the input terminals of the gate at the first stage of said first gating group while the first gating signal is inputted to one of the input terminals of the gate at the succeeding stage of said first gating group;

the second delayed gating signal being inputted to one of the input terminals of the gate at the first stage of said second gating group while the second gating signal is inputted to one of the input terminals of the gate at the succeeding stage of the second gating group;

said gates of said first and second gating groups being connected in cascade connection to each other while said oscillation loop is formed through the other ones of the input terminals of said gates.

6. The clock regeneration apparatus according to claim 2, wherein said edge detection section includes a delay circuit configured to delay the reception data signal by time shorter than the period of the reception data signal; and said edge detection section generates a rising edge detection signal and a falling edge detection signal by logical calculation between the reception data signal and a delay signal of said delay circuit and outputs the generated rising edge detection signal and the falling edge detection signal to said gating signal generation section.

7. The clock regeneration apparatus according to claim 6, wherein said phase decision section includes:

a first latch for latching the clock signal in synchronism with the reception data signal;

a second latch for latching the clock signal in synchronism with an inverted signal of the reception data signal; and a selector for selecting one of latch data of the first latch and latch data of the second latch in response to the level of the reception data signal and outputting the selected signal as a phase decision signal to said gating signal generation section.

8. The clock regeneration apparatus according to claim 2, further comprising an oscillation controlling signal generation section adapted to generate an oscillation frequency controlling signal, wherein said oscillator can output the clock signal having an oscillation frequency controlled based on the oscillation frequency controlling signal, and said oscillation controlling signal generation section includes an oscillator which has a configuration same as that of said oscillator and oscillates with a frequency in response to a controlling voltage, and generates the oscillation frequency controlling signal by a phase synchronizing loop including said oscillator.

9. The clock regeneration apparatus according to claim 2, wherein said oscillator outputs the clock signal and the internal clock signal which is an output of said first gating group to said phase decision section, and said phase decision section includes a first decision section configured to decide a phase of the clock signal for each edge of the reception data signal and output a result of the decision as a first phase decision signal, and a second decision section configured to decide a phase of the internal clock signal for each edge of the reception data signal and output a result of the decision as a second phase decision signal;

said gating signal generation section generating the first and second gating signals in response to a result of exclusive ORing of the first and second phase decision signals and the first phase decision signal.

10. An electronic equipment, comprising:

a clock regeneration apparatus; and a functional block adapted to carry out a process for a reception data signal in synchronism with a clock signal regenerated by said clock regeneration apparatus;

said clock regeneration apparatus including an oscillator including n gating groups connected in cascade connection to each other in such a manner as to be capable of forming an oscillation loop, n being an integer of two or more, said gating groups being controlled to gate an internal clock signal with first to nth gating signals different from one another, respectively, said oscillator outputting a clock signal at least from the nth one of said gating groups, an edge detection section adapted to detect an edge of a reception data signal, a phase decision section adapted to decide a phase of the clock signal for each edge of the reception data signal and output a result of the decision as a phase decision signal, and a gating signal generation section adapted to generate the first to nth gating signals and output the gating signals to first to nth ones of said gating groups of said oscillator, respectively;

said gating signal generation section being operable to select one of the gating signals into which an edge detection signal of said edge detection section is to be injected in response to the phase decision signal of said phase decision section, delaying the selected gating signal and outputting the gating signal to said oscillator;

said oscillator outputting the clock signal having a phase controlled based on the first to nth gating signals and synchronized with the reception data signal.

11. An electronic equipment, comprising:

a clock regeneration apparatus; and a functional block adapted to carry out a process for a reception data signal in synchronism with a clock signal regenerated by said clock regeneration apparatus;

said clock regeneration apparatus including an oscillator including first and second gating groups connected in cascade connection to each other in such a manner as to be capable of forming an oscillation loop, said first and second gating groups being controlled to gate an internal clock signal with first and second gating signals different from each other, respectively, said oscillator outputting a clock signal at least from said second gating group, an edge detection section adapted to detect an edge of a reception data signal, a phase decision section adapted to decide a phase of the clock signal for each edge of the reception data signal and output a result of the decision as a phase decision signal, and a gating signal generation section adapted to generate the first and second gating signals and output the first and second gating signals to said first and second gating groups of said oscillator, respectively;

said gating signal generation section being operable to generate, as the first gating signal, one of a signal which indicates rising edge detection and another signal which indicates falling edge detection based on a result of the detection by said edge detection section in response to a phase decision signal of said phase decision section, and delay the other one of the signals by one half cycle that of the reception data signal to generate the second gating signal;

said oscillator outputting the clock signal having a phase controlled based on the first and second gating signals and synchronized with the reception data signal.

* * * * *